(12) United States Patent
Muraki et al.

(10) Patent No.: US 7,868,803 B2
(45) Date of Patent: Jan. 11, 2011

(54) SEMICONDUCTOR DEVICE HAVING ΔΣ MODULATOR, AND SEMICONDUCTOR SYSTEM

(75) Inventors: Shiho Muraki, Osaka (JP); Naoya Iguchi, Shiga (JP); Kouichi Nagano, Osaka (JP); Kazuo Matsukawa, Osaka (JP); Masao Takayama, Hyogo (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 12/445,357

(22) PCT Filed: Oct. 11, 2007

(86) PCT No.: PCT/JP2007/069829
§ 371 (c)(1),
(2), (4) Date: Apr. 13, 2009

(87) PCT Pub. No.: WO2008/044725
PCT Pub. Date: Apr. 17, 2008

(65) Prior Publication Data
US 2010/0085228 A1 Apr. 8, 2010

(30) Foreign Application Priority Data
Oct. 13, 2006 (JP) ............................. 2006-280381

(51) Int. Cl.
*H03M 3/00* (2006.01)
(52) U.S. Cl. ...................................... 341/143; 341/155
(58) Field of Classification Search .................. 341/143, 341/155
See application file for complete search history.

(56) References Cited

U.S. PATENT DOCUMENTS 5,012,244 A 4/1991 Wellard et al.

(Continued)

FOREIGN PATENT DOCUMENTS

JP 5-22150 1/1993

(Continued)

OTHER PUBLICATIONS

International Search Report issued Nov. 6, 2007 in the International (PCT) Application No. PCT/JP2007/069829.

(Continued)

*Primary Examiner*—Khai M Nguyen
(74) *Attorney, Agent, or Firm*—Wenderoth, Lind & Ponack, L.L.P.

(57) ABSTRACT

A semiconductor device comprises an overflow detection circuit (5) which compares an output of at least one integrator in a ΔΣ modulator (13) with a predetermined value to output an overflow detection signal; an overflow frequency calculation circuit (6) which calculates an overflow frequency value that is the frequency of the output from the integrator being outside a normal range, based on the overflow detection signal, and outputs the overflow frequency value; an oscillation judgment circuit (7) which judges whether the ΔΣ modulator (13) is in the oscillation state or not based on the overflow frequency value; and an oscillation halt circuit which suppresses oscillation of the ΔΣ modulator (13) when the oscillation judgment circuit (7) judges that the ΔΣ modulator is in the oscillation state; wherein it is determined whether the output of the integrator is temporarily outside the normal range due to noise or the like or the output of the integrator is outside the normal range due to oscillation, by obtaining the frequency with which the output of the integrator is outside the normal range, and the oscillation of the ΔΣ modulator (13) is suppressed only when it is oscillated.

70 Claims, 19 Drawing Sheets

U.S. PATENT DOCUMENTS

| | | | |
|---|---|---|---|
| 5,248,972 A | 9/1993 | Karema et al. | |
| 5,793,811 A * | 8/1998 | Yu | 375/247 |
| 5,805,093 A | 9/1998 | Heikkilä et al. | |
| 6,020,836 A * | 2/2000 | Tlaskal | 341/143 |
| 6,115,731 A | 9/2000 | Hendricks | |
| 6,362,763 B1 * | 3/2002 | Wang | 341/143 |
| 6,538,865 B1 | 3/2003 | Nagatani et al. | |
| 6,765,520 B1 * | 7/2004 | Chuang et al. | 341/143 |

FOREIGN PATENT DOCUMENTS

| | | |
|---|---|---|
| JP | 5-110442 | 4/1993 |
| JP | 10-501390 | 2/1998 |
| JP | 10-84282 | 3/1998 |
| JP | 11-330981 | 11/1999 |
| JP | 2000-295141 | 10/2000 |
| JP | 3192256 | 5/2001 |
| JP | 2002-118431 | 4/2002 |
| JP | 2003-124812 | 4/2003 |
| WO | 95/34955 | 12/1995 |

OTHER PUBLICATIONS

Written Opinion of the ISA issued Nov. 6, 2007 in the International (PCT) Application No. PCT/JP2007/069829.

Chris Dunn et al., "Use of Clipping in Sigma-Delta Modulators, Oversampling Techniques and Sigma-Delta Modulations", IEE Colloquium on, Mar. 30, 1994, pp. 8/1-8/9.

* cited by examiner

SEMICONDUCTOR DEVICE HAVING ΔΣ MODULATOR, AND SEMICONDUCTOR SYSTEM

TECHNICAL FIELD

The present invention relates to a semiconductor device and a semiconductor system which appropriately detect the oscillation state of a ΔΣ modulator.

BACKGROUND ART

In a conventional semiconductor device or semiconductor system having a ΔΣ modulator, a microcomputer or the like confirms an overflow detection signal outputted from a ΔΣ modulator and resets the internal state of the ΔΣ modulator, thereby to restore the ΔΣ modulator from its oscillation state (for example, refer to Patent Document 1).

Hereinafter, a conventional semiconductor device having a ΔΣ modulator will be described.

FIG. 19 is a block diagram illustrating the configuration of a conventional semiconductor device having a ΔΣ A/D converter.

The conventional semiconductor device includes a ΔΣ A/D converter 100 which converts input analog data A into digital data B, and a microcomputer 101 which confirms an overflow detection signal C outputted from the ΔΣ A/D converter 100, and issues a command of ΔΣ A/D converter soft reset setting D for resetting the ΔΣ A/D converter 100.

When the ΔΣ A/D converter 100 performs ΔΣ conversion of second order or more with integrators being cascade-connected, the internal state of the circuit might be oscillated in response to a large input signal or an input signal which steeply varies in steps. Once such oscillation occurs in the ΔΣ A/D converter 100, its amplitude is gradually increased, and circuit elements such as an operation amplifier which are driven by a limited power supply voltage become incapable of performing linear normal operation to lose operation accuracy, and thereby the ΔΣ A/D converter 100 becomes incapable of performing normal A/D conversion. Even when the input signal returns to the normal value after the start of oscillation, the ΔΣ A/D converter 100 might continue the oscillation. In this case, it is necessary to detect the oscillation and reset the internal state of the ΔΣ A/D converter 100. For this purpose, the ΔΣ A/D converter 100 is configured so as to compare the output of the integrator with a predetermined comparator threshold value, and output an overflow detection signal C to the microcomputer 101 to inform that overflow occurs in the ΔΣ A/D converter 100. The microcomputer 101 confirms the overflow detection signal C, and transfers a ΔΣ A/D converter soft reset setting D when overflow occurs in the ΔΣ A/D converter 100, thereby to reset the internal state of the ΔΣ A/D converter 100 and restore the A/D converter 100 from the oscillation state.

Patent Document 1: Japanese Patent No. 3192256
Patent Document 2: Specification of U.S. Ser. No. 5,012,244

DISCLOSE OF THE INVENTION

Problems to be Solved by the Invention

As described above, while the conventional semiconductor device having the ΔΣ modulator can restore the ΔΣ modulator from its oscillation state when the ΔΣ modulator is oscillated, overflow might temporarily occur due to noise or the like, which causes a problem of excessive resetting. Therefore, it is necessary to appropriately detect the oscillation state of the ΔΣ modulator.

The present invention is made to solve the above-described problems and has for its object to provide a semiconductor device and a semiconductor system in which the internal state of the ΔΣ modulator is not reset when overflow temporarily occurs but the internal state of the ΔΣ modulator is reset only when the oscillation state is continued, thereby to restore the ΔΣ modulator from the oscillation state to the normally operable state without performing excessive resetting when overflow temporarily occurs due to noise or the like.

Measures to Solve the Problems

In order to achieve the above-described objects, according to Claim 1 of the present invention, there is provided a semiconductor device comprising: a ΔΣ modulator having a quantizer which quantizes output signals of integrators; an overflow detection circuit which compares the output of at least one integrator in the ΔΣ modulator with a predetermined value to output an overflow detection signal; an overflow frequency calculation circuit which calculates an overflow frequency value that is the frequency of the output from the integrator being outside a normal range, based on the overflow detection signal, and outputs the overflow frequency value; an oscillation judgment circuit which judges whether the ΔΣ modulator is in the oscillation state or not based on the overflow frequency value; and an oscillation halt circuit which suppresses oscillation of the ΔΣ modulator when the oscillation judgment circuit judges that the ΔΣ modulator is in the oscillation state.

According to Claim 2 of the present invention, in the semiconductor device defined in Claim 1, when the output signal of the ΔΣ modulator is a multi-bit signal, the overflow detection circuit compares the output signal of the quantizer in the ΔΣ modulator with a predetermined value to output an overflow detection signal.

According to Claim 3 of the present invention, in the semiconductor device defined in Claim 1 or 2, the predetermined value of the overflow detection circuit is variable.

According to Claim 4 of the present invention, in the semiconductor device defined in Claim 1, the overflow frequency calculation circuit integrates the overflow detection signal to output the overflow frequency value.

According to Claim 5 of the present invention, in the semiconductor device defined in Claim 1 or 4, the overflow frequency calculation circuit counts the number of times the overflow detection signal is detected within a predetermined period, and outputs the count value as the overflow frequency value.

According to Claim 6 of the present invention, in the semiconductor device defined in Claim 1 or 4, the oscillation judgment circuit compares the overflow frequency value with a threshold value, and judges that the ΔΣ modulator is in the oscillation state when the number of times by which the state where the overflow frequency value becomes equal to or larger than the threshold value is continued becomes equal to or larger than a predetermined number of times.

According to Claim 7 of the present invention, in the semiconductor device defined in Claim 1 or 4, the period for calculating the overflow frequency value and the threshold value of the oscillation judgment circuit are variable.

According to Claim 8 of the present invention, in the semiconductor device defined in Claim 1, the overflow frequency calculation circuit is a low-pass filter.

According to Claim 9 of the present invention, in the semiconductor device defined in Claim 1, the oscillation judgment circuit is a comparator which compares the overflow frequency value with a predetermined value.

According to Claim 10 of the present invention, in the semiconductor device defined in Claim 1, the oscillation halt circuit is software.

According to Claim 11 of the present invention, in the semiconductor device defined in Claim 1, the oscillation halt circuit is hardware.

According to Claim 12 of the present invention, in the semiconductor device defined in Claim 1, the oscillation halt circuit can be switched between software and hardware.

According to Claim 13 of the present invention, in the semiconductor device defined in Claim 1, the oscillation halt circuit initializes the integrators in the $\Delta\Sigma$ modulator.

According to Claim 14 of the present invention, in the semiconductor device defined in Claim 1, the oscillation halt circuit changes the multipliers of the integrators in the $\Delta\Sigma$ modulator.

According to Claim 15 of the present invention, in the semiconductor device defined in Claim 1, the oscillation halt circuit narrows the output range of the integrators in the $\Delta\Sigma$ modulator.

According to Claim 16 of the present invention, in the semiconductor device defined in Claim 4, the oscillation judgment circuit is a comparator which compares the overflow frequency value with a predetermined value, and the oscillation halt circuit initializes the integrators in the $\Delta\Sigma$ modulator.

According to Claim 17 of the present invention, in the semiconductor device defined in any of Claims 1 to 16, the $\Delta\Sigma$ modulator is a D/A converter.

According to Claim 18 of the present invention, in the semiconductor device defined in any of Claims 1 to 16, the $\Delta\Sigma$ modulator is an A/D converter.

According to Claim 19 of the present invention, in the semiconductor device defined in Claim 17 or 18, the overflow detection circuit does not output the overflow detection signal until the $\Delta\Sigma$ modulator is stabilized immediately after start-up or after oscillation is suppressed.

According to Claim 20 of the present invention, in the semiconductor device defined in Claim 17 or 18, the overflow frequency calculation circuit does not output the overflow frequency value until the $\Delta\Sigma$ modulator is stabilized immediately after start-up or after oscillation is suppressed.

According to Claim 21 of the present invention, in the semiconductor device defined in Claim 17 or 18, the oscillation judgment circuit does not judge that the $\Delta\Sigma$ modulator is in the oscillation state until the $\Delta\Sigma$ modulator is stabilized immediately after start-up or after oscillation is suppressed.

According to Claim 22 of the present invention, in the semiconductor device defined in Claim 17 or 18, the oscillation halt circuit does not halt oscillation until the $\Delta\Sigma$ modulator is stabilized immediately after start-up or after oscillation is suppressed.

According to Claim 23 of the present invention, a semiconductor system having the semiconductor device defined in any of Claims 19 to 22 includes a signal processing circuit which processes the data outputted from the semiconductor device, and the signal processing circuit adjusts the output of the $\Delta\Sigma$ modulator to fade out or turn off the same when the oscillation judgment circuit judges that the $\Delta\Sigma$ modulator is in the oscillation state.

According to Claim 24 of the present invention, a semiconductor system having the semiconductor device defined in any of Claims 19 to 22 includes an input amplitude restriction circuit which outputs the data with its input amplitude being adjusted, to the $\Delta\Sigma$ modulator in the semiconductor device, and the input amplitude restriction circuit adjusts the input amplitude of the $\Delta\Sigma$ modulator when the oscillation judgment circuit judges that the $\Delta\Sigma$ modulator is in the oscillation state.

According to Claim 25 of the present invention, the semiconductor system defined in Claim 23 or 24 further includes a just-before-oscillation judgment circuit which judges whether the $\Delta\Sigma$ modulator is in the state just before oscillation or not based on the overflow frequency value, the predetermined value of the overflow detection circuit is changed to a value within a range of reference values obtained when no oscillation is detected, the overflow frequency calculation circuit calculates the overflow frequency value on the basis of the overflow detection signal which is obtained by comparing the output of the integrator in the $\Delta\Sigma$ modulator with the changed predetermined value by the overflow detection circuit, and the just-before-oscillation judgment circuit detects the state of the $\Delta\Sigma$ modulator just before oscillation.

According to Claim 26 of the present invention, the semiconductor system defined in Claim 23 or 24 further includes a just-before-oscillation judgment circuit which judges whether the $\Delta\Sigma$ modulator is in the state just before oscillation or not based on the overflow frequency value, the judgment reference value of the just-before-oscillation judgment circuit is changed to a value within a range of reference values obtained when no oscillation is detected, and the just-before-oscillation judgment circuit compares the overflow frequency value with the changed judgment reference value to detect the state of the $\Delta\Sigma$ modulator just before oscillation.

According to Claim 27 of the present invention, there is provided a semiconductor device comprising: a $\Delta\Sigma$ A/D converter which outputs an overflow detection signal; and an oscillation detection circuit which integrates the overflow detection signal to detect the oscillation state of the $\Delta\Sigma$ A/D converter; the oscillation detection circuit including a count circuit which counts the number of times the overflow detection signal is detected within a predetermined period, and outputs the count value, a comparison circuit which compares the count value with a threshold value, and judges that the $\Delta\Sigma$ A/D converter is in the oscillation state when the number of overflow detections within the predetermined period is equal to or larger than the threshold value, and then enables the oscillation detection signal to output the same, and a reset generation circuit which receives the oscillation detection signal, and generates a hard reset signal for resetting the $\Delta\Sigma$ A/D converter, wherein the oscillation detection circuit resets the $\Delta\Sigma$ A/D converter when the oscillation detection circuit detects that the $\Delta\Sigma$ A/D converter is in the oscillation state.

According to Claim 28 of the present invention, there is provided a semiconductor device comprising: a $\Delta\Sigma$ A/D converter which outputs an overflow detection signal; an oscillation detection circuit which integrates the overflow detection signal to detect the oscillation state of the $\Delta\Sigma$ A/D converter; and a microcomputer which transfers a command for resetting the $\Delta\Sigma$ A/D converter on the basis of an oscillation detection monitor signal outputted from the oscillation detection circuit; the oscillation detection circuit including a count circuit which counts the number of times the overflow detection signal is detected within a predetermined period, and outputs the count value, and a comparison circuit which compares the count value with a threshold value, and judges that the $\Delta\Sigma$ A/D converter is in the oscillation state when the number of overflow detections within the predetermined period is equal to or larger than the threshold value, and then outputs the oscillation detection monitor signal holding the oscillation detection information to the microcomputer, wherein the microcomputer resets the ΔΣ A/D converter when the oscillation detection circuit detects that the ΔΣ A/D converter is in the oscillation state.

According to Claim 29 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter; the oscillation detection circuit including a count circuit which counts the number of times the overflow detection signal is detected within a predetermined period, and outputs the count value, a comparison circuit which compares the count value with a threshold value, and judges that the ΔΣ A/D converter is in the oscillation state when the number of overflow detections within the predetermined period is equal to or larger than the threshold value, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, the reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

According to Claim 30 of the present invention, there is provided a semiconductor device comprising: a ΔΣ A/D converter which outputs an overflow detection signal; and an oscillation detection circuit which integrates the overflow detection signal to detect the oscillation state of the ΔΣ A/D converter; the oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then enables the oscillation detection signal to output the same, and a reset generation circuit which receives the oscillation detection signal, and generates a hard reset signal for resetting the ΔΣ A/D converter, wherein the oscillation detection circuit resets the ΔΣ A/D converter when it detects that the ΔΣ A/D converter is in the oscillation state.

According to Claim 31 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; and a microcomputer which transfers a command for resetting the ΔΣ A/D converter on the basis of an oscillation detection monitor signal outputted from the oscillation detection circuit; the oscillation detection circuit including a count circuit which counts the number of times the overflow detection signal is detected within a predetermined period after waiting until the ΔΣ A/D converter is stabilized, and outputs the count value, and a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then outputs the oscillation detection monitor signal holding the oscillation detection information to the microcomputer, wherein the microcomputer resets the ΔΣ A/D converter when the oscillation detection circuit detects that the ΔΣ A/D converter is in the oscillation state.

According to Claim 32 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter; the oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, the reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

According to Claim 33 of the present invention, there is provided a semiconductor device comprising: a ΔΣ A/D converter which outputs an overflow detection signal; and an oscillation detection circuit which integrates the overflow detection signal to detect the oscillation state of the ΔΣ A/D converter; the oscillation detection circuit including a count circuit which counts the number of times the overflow detection signal is detected within a predetermined period, and outputs the count value, a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then enables the oscillation detection signal to output the same, and a reset generation circuit which receives the oscillation detection signal, and generates a hard reset signal for resetting the ΔΣ A/D converter, wherein the oscillation detection circuit resets the ΔΣ A/D converter when it detects that the ΔΣ A/D converter is in the oscillation state.

According to Claim 34 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; and a microcomputer which transfers a command for resetting the ΔΣ A/D converter on the basis of an oscillation detection monitor signal outputted from the oscillation detection circuit; the oscillation detection circuit including a count circuit which counts the number of times the overflow detection signal is detected within a predetermined period, and outputs the count value, and a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then outputs the oscillation detection monitor signal holding the oscillation detection information to the microcomputer, wherein the microcomputer resets the ΔΣ A/D converter when the oscillation detection circuit detects that the ΔΣ A/D converter is in the oscillation state.

According to Claim 35 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter; the oscillation detection circuit including a count circuit which counts the number of times the overflow detection signal is detected within a predetermined period, and outputs the count value, a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, the reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

According to Claim 36 of the present invention, there is provided a semiconductor device comprising: a ΔΣ A/D converter which outputs an overflow detection signal; and an oscillation detection circuit which integrates the overflow detection signal to detect the oscillation state of the ΔΣ A/D converter; the oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then enables the oscillation detection signal to output the same, and a reset generation circuit which receives the oscillation detection signal, and generates a hard reset signal for resetting the ΔΣ A/D converter, wherein the oscillation detection circuit resets the ΔΣ A/D converter when it detects that the ΔΣ A/D converter is in the oscillation state.

According to Claim 37 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; and a microcomputer which transfers a command for resetting the ΔΣ A/D converter on the basis of an oscillation detection monitor signal outputted from the oscillation detection circuit; the oscillation detection circuit including a count circuit which counts the number of times the overflow detection signal is detected within a predetermined period after waiting until the ΔΣ A/D converter is stabilized, and outputs the count value, and a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then outputs the oscillation detection monitor signal holding the oscillation detection information to the microcomputer, wherein the microcomputer resets the ΔΣ A/D converter when the oscillation detection circuit detects that the ΔΣ A/D converter is in the oscillation state.

According to Claim 38 of the present invention, there is provided a semiconductor device comprising: a ΔΣ A/D converter which outputs an overflow detection signal; an oscillation detection circuit which integrates the overflow detection signal to detect the oscillation state of the ΔΣ A/D converter; a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter; the oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, the reset selection circuit selects either of resetting the ΔΣ A/D converter by the oscillation detection circuit or resetting the ΔΣ A/D converter by the microcomputer, based on a ΔΣ A/D converter hard reset enable setting which is set from the microcomputer.

According to Claim 39 of the present invention, the semiconductor device defined in any of Claims 27 to 29 further includes a microcomputer which transfers an oscillation detection condition setting command to the oscillation detection circuit, and the oscillation detection circuit judges whether the $\Delta\Sigma$ A/D converter is in the oscillation state or not by comparing the result of counting the number of detection times of the overflow detection signal within the predetermined period based on the oscillation detection period setting which is outputted from the microcomputer, with the oscillation detection threshold value setting which is outputted from the microcomputer.

According to Claim 40 of the present invention, the semiconductor device defined in any of Claims 30 to 32 further includes a microcomputer which transfers an oscillation detection condition setting command to the oscillation detection circuit, and the oscillation detection circuit judges whether the $\Delta\Sigma$ A/D converter is in the oscillation state or not by comparing the result of counting the number of detection times of the overflow detection signal within the predetermined period based on the oscillation detection period setting which is outputted from the microcomputer after waiting until the $\Delta\Sigma$ A/D converter is stabilized based on the $\Delta\Sigma$ A/D converter stabilization wait setting which is outputted from the microcomputer, with the oscillation detection threshold value setting which is outputted from the microcomputer.

According to Claim 41 of the present invention, the semiconductor device defined in any of Claims 33 to 35 further includes a microcomputer which transfers an oscillation detection condition setting command to the oscillation detection circuit, and the oscillation detection circuit judges that the $\Delta\Sigma$ A/D converter is in the oscillation state when the state where the result of counting the number of detection times of the overflow detection signal within the predetermined period based on the oscillation detection period setting which is outputted from the microcomputer is larger than the oscillation detection threshold value setting which is outputted from the microcomputer is continued by the number of times equal to or larger than the oscillation detection continuous number of times setting which is outputted from the microcomputer.

According to Claim 42 of the present invention, the semiconductor device defined in any of Claims 36 to 38 further includes a microcomputer which transfers an oscillation detection condition setting command to the oscillation detection circuit, and the oscillation detection circuit judges that the $\Delta\Sigma$ A/D converter is in the oscillation state when the state where the result of counting the number of detection times of the overflow detection signal within the predetermined period based on the oscillation detection period setting which is outputted from the microcomputer after waiting until the $\Delta\Sigma$ A/D converter is stabilized based on the $\Delta\Sigma$ A/D converter stabilization wait setting which is outputted from the microcomputer is larger than the oscillation detection threshold value setting which is outputted from the microcomputer is continued by the number of times equal to or larger than the oscillation detection continuous number of times setting which is outputted from the microcomputer.

According to Claim 43 of the present invention, a semiconductor system having the semiconductor device defined in any of Claims 27 to 42 further includes a signal processing circuit which processes data outputted from the semiconductor device, and the signal processing circuit receives $\Delta\Sigma$ A/D converter reset signal from the semiconductor device, and performs a fadeout processing for the data when the $\Delta\Sigma$ A/D converter is reset.

According to Claim 44 of the present invention, a semiconductor system having the semiconductor device defined in any of Claims 28, 29, 31, 32, 34, 35, 37, 38, and 39 to 42 further includes an input amplitude restriction circuit which outputs the data with its input amplitude being adjusted, to the $\Delta\Sigma$ A/D converter in the semiconductor device, the microcomputer in the semiconductor device confirms the oscillation detection monitor signal and transfers a $\Delta\Sigma$ A/D converter oscillation confirmation command to the input amplitude restriction circuit when the $\Delta\Sigma$ A/D converter is in the oscillation state, and the input amplitude restriction circuit outputs the data with its input amplitude being reduced when the $\Delta\Sigma$ A/D converter is in the oscillation state.

Effects of the Invention

In the semiconductor device and the semiconductor system according to the present invention, even when the overflow detection signal outputted from the $\Delta\Sigma$ A/D converter shows the overflow state, the overflow detection signal outputted from the $\Delta\Sigma$ A/D converter is counted according to the oscillation detection condition without immediately judging that the A/D converter is in the oscillation state, and only when the count number is larger than the threshold value, it is judged that the $\Delta\Sigma$ A/D converter is oscillated, thereby appropriately detecting the oscillation state of the $\Delta\Sigma$ A/D converter. The internal state of the $\Delta\Sigma$ A/D converter is not reset when overflow temporarily occurs, but it is reset only when the oscillation state is continued, and thereby the $\Delta\Sigma$ A/D converter can be restored to the normally operable state from the oscillation state without unnecessarily resetting the same.

Further, since the output amplitudes of the plural-stage integrators in the $\Delta\Sigma$ modulator exceed the normal value when the $\Delta\Sigma$ modulator is oscillated, the output amplitude of one or plural integrators among the plural-stage integrators is monitored to be compared with the predetermined value so as to output an overflow detection signal when the amplitude exceeds the predetermined value to the outside of the normal range, and the frequency with which the output of the integrator is outside the normal range is obtained from the overflow detection signal by the overflow frequency calculation circuit. By obtaining this frequency, it is possible to determine whether the output of the integrator is temporarily outside the normal range due to noise or the like or it is outside the normal range due to oscillation, and the oscillation of the $\Delta\Sigma$ modulator can be suppressed only when it is oscillated.

DESCRIPTION OF REFERENCE NUMERALS

Figure 1:
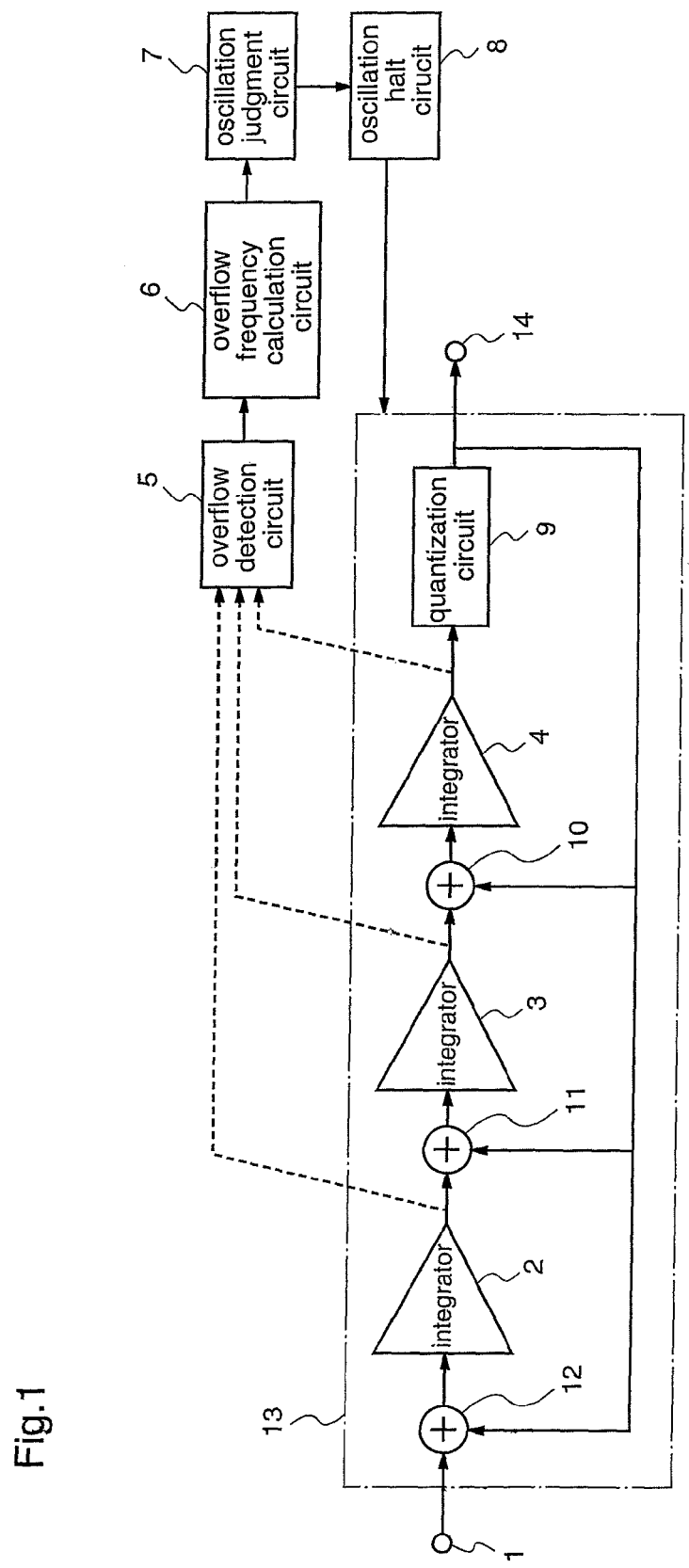
FIG. 1 is a block diagram illustrating a semiconductor device according to a first embodiment of the present invention.

1 . . . input terminal
2,3,4 . . . integrator
5 . . . overflow detection circuit
6 . . . overflow frequency detection circuit
7 . . . oscillation judgment circuit
8 . . . oscillation halt circuit
9 . . . quantization circuit
10,11,12 . . . arithmetic unit
13 . . . $\Delta\Sigma$ modulator
14 . . . output terminal
16 . . . signal processing circuit
17 . . . input amplitude restriction circuit
18 . . . just-before-oscillation judgment circuit
100 . . . $\Delta\Sigma$ A/D converter
101 . . . microcomputer
112,1112,2112,3112,4112 . . . oscillation detection circuit
113 . . . reset selection circuit
114 . . . signal processing circuit
115 . . . input amplitude restriction circuit
201,1201,3201,4201 . . . count circuit
202,2202,3202,4202 . . . comparison circuit
203 . . . reset generation circuit
201$a$,1201$a$,4201$a$ . . . detection timing generation circuit
201$b$,1201$b$,4201$b$ . . . overflow count circuit
4202$a$ . . . oscillation detection signal generation circuit
4202$b$ . . . oscillation detection monitor signal generation circuit
A . . . input analog data signal
B . . . digital data signal
C . . . overflow detection signal
D . . . $\Delta\Sigma$ A/D converter soft reset setting
E . . . oscillation detection period setting
F . . . oscillation threshold value setting
G . . . oscillation detection monitor signal
H . . . oscillation detection circuit reset signal
I . . . overflow count
J . . . oscillation detection signal
K . . . $\Delta\Sigma$ A/D converter hard reset signal
L . . . $\Delta\Sigma$ A/D converter stabilization wait setting
M . . . oscillation detection continuous number of times setting
N . . . $\Delta\Sigma$ A/D converter hard reset enable setting
O . . . $\Delta\Sigma$ A/D converter reset signal
P . . . $\Delta\Sigma$ A/D converter oscillation confirmation command
Q . . . output of signal processing unit
R . . . number of continuous oscillation detections
S . . . detection timing signal
T . . . clear signal for oscillation detection monitor signal

BEST MODE TO EXECUTE THE INVENTION

Embodiment 1

FIG. 1 is a block diagram illustrating the configuration of a semiconductor device of a first embodiment which is applied to detection of oscillation of a third-order $\Delta\Sigma$ modulator having a switched capacitor circuit.

In FIG. 1, reference numeral 1 denotes an input terminal, 5 denotes an overflow detection circuit, 6 denotes an overflow frequency calculation circuit, 7 denotes an oscillation judgment circuit, 8 denotes an oscillation halt circuit, 14 denotes an output terminal, and 13 denotes a $\Delta\Sigma$ modulator. The $\Delta\Sigma$ modulator comprises arithmetic units 10, 11, and 12, integrators 2, 3, and 4, and a quantization circuit 9. The integrators 2 to 4 are cascade-connected first to third integrators constituting an integrator circuit. The integrator circuit of this first embodiment comprises the three integrators connected in series. The integrator circuit may include at least one integrator, and the integrators may be connected in series, in parallel, or a combination thereof. The $\Delta\Sigma$ modulator 13 may be an A/D converter or a D/A converter.

Reference numeral 9 denotes a quantization circuit 9 which quantizes an output signal from the integrator circuit to 1 or 0 with a predetermined threshold value, and it outputs an output signal of the $\Delta\Sigma$ modulator 13. Reference numeral 12 denotes an arithmetic unit which performs an arithmetic operation of the output signal from the input terminal 1 with the output from the quantization circuit 9. Reference numerals 10 and 11 denote arithmetic units which perform arithmetic operations of the outputs from the integrators 1 and 2 with the output from the quantization circuit 9, respectively.

Further, reference numeral 5 denotes an overflow detection circuit 5 which monitors one or plural outputs of the multiple-stage integrators, compares the output amplitude with a predetermined value, and outputs an overflow detection signal showing the overflow state when the output amplitude of at least one of the integrators exceeds the predetermined value over a normal range. The predetermined value of the overflow detection circuit 5 may be variable.

Reference numeral 6 denotes an overflow frequency calculation circuit which passes the overflow detection signal through a low-pass filter to cut a temporal abnormality of signal amplitude, and outputs an overflow frequency value. Since the overflow frequency calculation circuit 6 passes the overflow detection signal through the filter and performs oscillation judgment according to the result, false oscillation judgment can be avoided. The overflow frequency calculation circuit 6 may integrate the overflow detection signal to output an overflow frequency value. Reference numeral 7 denotes an oscillation judgment circuit 7 which compares the overflow frequency value with a predetermined value, and judges that the $\Delta\Sigma$ modulator 13 is in the oscillation state when the overflow frequency value is larger than the predetermined value. The predetermined value of the oscillation judgment circuit 7 may be variable.

Reference numeral 8 denotes an oscillation halt circuit 8 which suppresses oscillation by resetting the integrators 2, 3, and 4 when the oscillation judgment circuit 7 judges that the ΔΣ modulator 13 is in the oscillation state. The oscillation halt circuit 8 may stabilize the operation by reducing the outputs of the integrators 2, 3, and 4 with the multipliers of the integrators 2, 3, and 4 being changed. Further, the oscillation halt circuit 8 may stabilize the operation by narrowing the output range of the integrators 2, 3, and 4. Furthermore, the oscillation halt circuit 8 may be configured as software or hardware, or it may be switched between software and hardware.

Hereinafter, the configuration and operation will be described in detail.

A description will be given of an example of the semiconductor device of this first embodiment in which a count circuit is used as the overflow frequency calculation circuit 5, a comparison circuit is used as the oscillation judgment circuit 7, a reset generation circuit is used as the oscillation halt circuit 8, and a ΔΣ A/D converter is used as the ΔΣ modulator 13.

While the overflow frequency calculation circuit 6 in the semiconductor device shown in FIG. 1 is configured so that the overflow detection signal is passed through the low-pass filter, when a count circuit is used as the overflow frequency calculation circuit 6, the overflow frequency calculation circuit 6 counts the number of times the overflow detection signal shows the overflow state within a predetermined period, and outputs the count value indicating the number of times as an overflow frequency value. In this case, the count value is reset for each predetermined period. The predetermined period may be variable.

Figure 2:
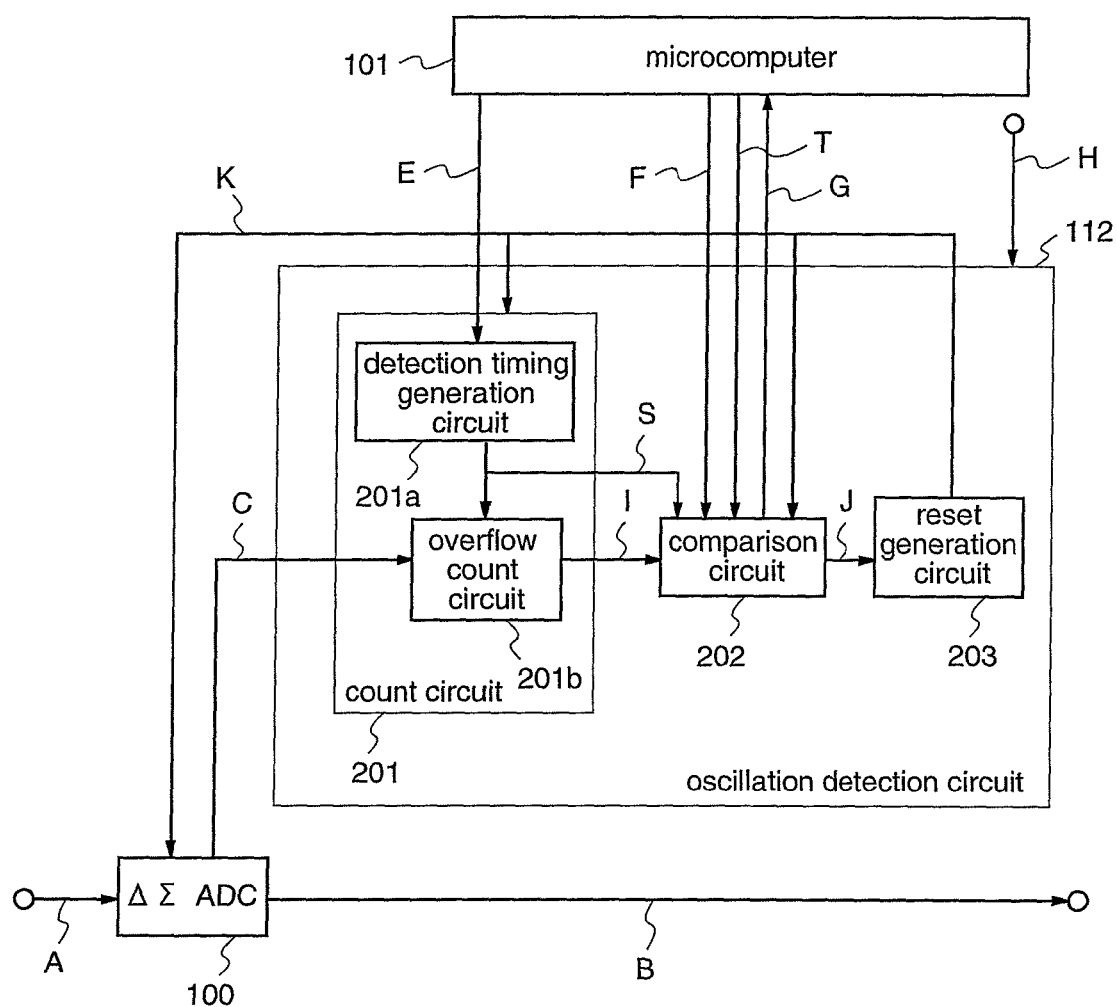
FIG. 2 is a block diagram illustrating an example of the semiconductor device of the first embodiment.

FIG. 2 is a block diagram illustrating the configuration of the example of the semiconductor device according to the first embodiment.

The semiconductor device of this first embodiment includes a ΔΣ A/D converter 100 which converts an input analog data signal A into a digital data signal B, an oscillation detection circuit 112 which detects the oscillation state of the ΔΣ A/D converter 100 by integrating the overflow detection signal C outputted from the ΔΣ A/D converter 100 to generate a ΔΣ A/D converter hard reset signal K, and a microcomputer 101 which sets the oscillation detection condition. The oscillation detection circuit 112 includes a count circuit 201 which counts the number of times the overflow detection signal C outputted from the ΔΣ A/D converter 100 is detected within a predetermined period, a comparison circuit 202 which compares the count value I outputted from the count circuit 201 with an oscillation threshold value setting F, and a reset generation circuit 203 which generates a ΔΣ A/D converter hard reset signal K from an oscillation detection signal J outputted from the comparison circuit 202. The counter circuit 201 includes a detection timing generation circuit 201a which generates a detection timing signal S indicating the timing of overflow detection on the basis of an oscillation detection period setting E, and an overflow count circuit 201b which counts the number of times the overflow detection signal C is detected within a predetermined period. The oscillation detection period setting E is supplied from the microcomputer 101 to the detection timing generation circuit 201a, and the detection timing signal S is outputted from the detection timing generation circuit 201a to the overflow count circuit 201b and to the comparison circuit 202. The overflow count circuit 201b receives the overflow detection signal C from the ΔΣ A/D converter 100, counts the number of times the overflow detection signal C is detected within the period of the oscillation detection period setting E on the basis of the detection timing signal S, and outputs the count value I to the comparison circuit 202.

The ΔΣ A/D converter 100 and the microcomputer 101 are identical to those of the conventional semiconductor device.

Figure 3:
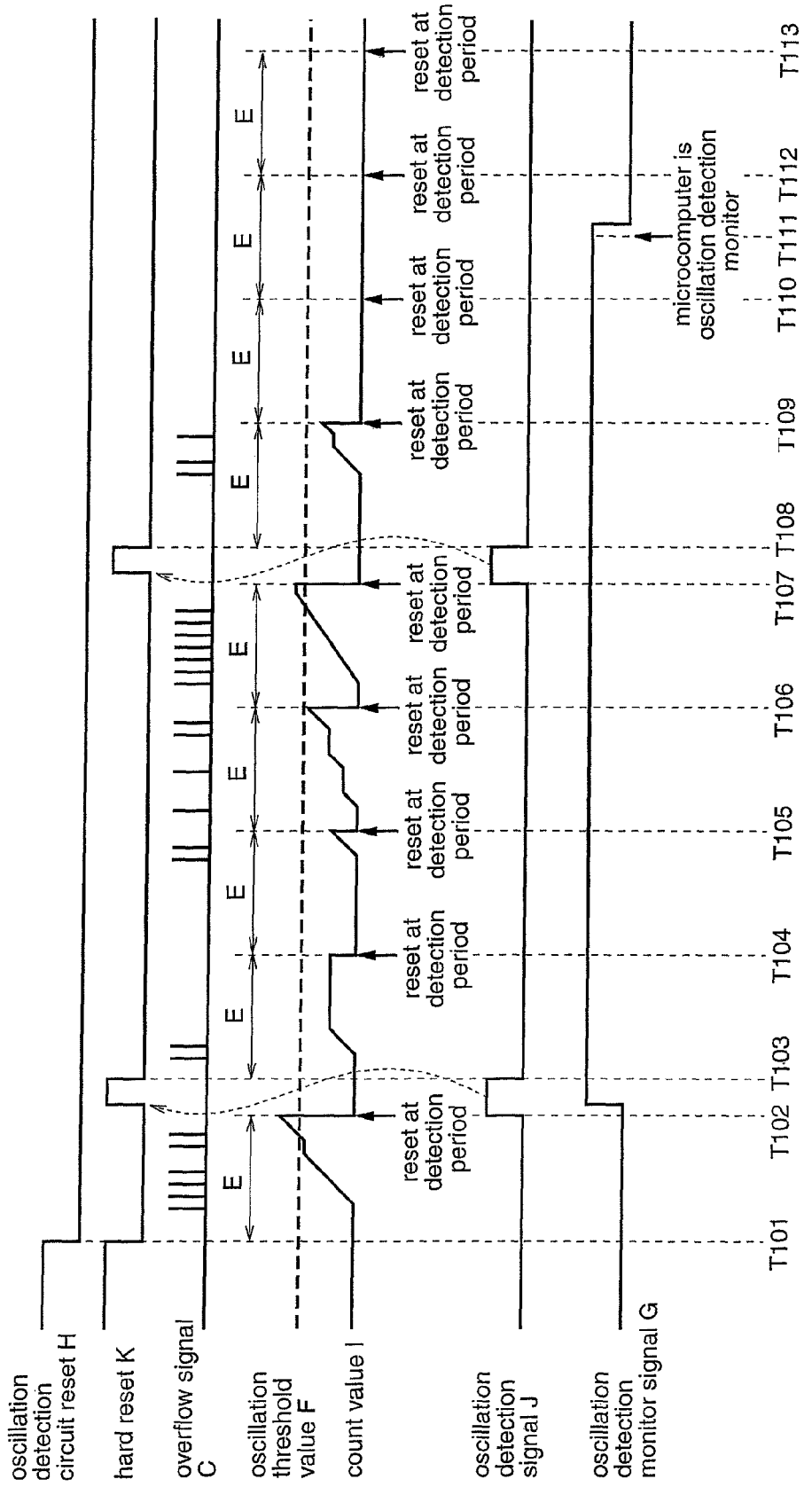
FIG. 3 is a timing chart of the semiconductor device of the first embodiment shown in FIG. 2.

FIG. 3 is a timing chart of the oscillation detection for the ΔΣ A/D converter in the semiconductor device of the first embodiment shown in FIG. 1. The operation of detecting the oscillation state of the ΔΣ A/D converter will be described with reference to FIG. 3.

The microcomputer 101 sets the oscillation detection period setting E in the count circuit 201 in the oscillation detection circuit 112, and sets the oscillation threshold value setting F in the comparison circuit 202 in the oscillation detection circuit 112. In the count circuit 201, after an oscillation detection circuit reset H is released (timing T101), the number of times the overflow detection signal C outputted from the ΔΣ A/D converter 100 shows the overflow state is counted for each period of the oscillation detection period setting E, and the count value I as the number of times is outputted to the comparison circuit 202. The count value I is reset for each period of the oscillation detection period setting E on the basis of the detection timing signal S (timings T102, T104 to T107, T109, T110, T112, T113).

In the comparison circuit 202, the count value I is compared with the oscillation threshold value setting F for each period of the oscillation detection period setting E (timings T102, T104 to T107, T109, T110, T112, T113) on the basis of the detection timing signal S. When the count value I is larger than the oscillation threshold value setting F (timings T102, T107), the oscillation detection signal J is set to "H" and outputted to the reset generation circuit 203. In the reset generation circuit 203, a ΔΣ A/D converter hard reset signal K is generated so as to reset the internal state of the ΔΣ A/D converter 100 when the oscillation detection signal J becomes "H", and the hard reset signal K is outputted to the ΔΣ A/D converter 100. Further, the hard reset signal K outputted from the reset generation circuit 203 is input to the comparison circuit 202, and the oscillation detection signal J is restored to "L" by the hard reset signal K to wait for next oscillation detection. Further, the hard reset signal K outputted from the reset generation circuit 203 is input to the count circuit 201, and a next oscillation detection period is started when the hard reset signal K is released (timings T103, T108).

It is desirable that an oscillation detection monitor signal G should be outputted to the microcomputer 101 so that the microcomputer 101 can confirm that the oscillation detection circuit 112 has reset the internal state of the ΔΣ A/D converter 100. To be specific, when the oscillation detection signal J becomes "H" (timing T102), the oscillation detection monitor signal G is set to "H". When the microcomputer 101 reads out the oscillation detection monitor signal G and confirms the oscillation state of the ΔΣ A/D converter 100 (timing T111), the microcomputer 101 outputs an oscillation detection monitor signal clear signal T to the comparison circuit 202 to set the oscillation detection monitor signal G to "L", and thereby the microcomputer 101 can surely confirm that the oscillation detection circuit 112 has reset the ΔΣ A/D converter 100.

As described above, the semiconductor device of this first embodiment is provided with the oscillation detection circuit 112 including the count circuit 201 which counts the number of times the overflow detection signal C is detected within the period of the oscillation detection period setting E, and outputs the count value I, the comparison circuit 202 which compares the count value I with the oscillation threshold value setting F, and judges that the ΔΣ A/D converter 100 is in the oscillation state when the number of overflow detections within the period of the oscillation detection period setting E is equal to or larger than the threshold value, and then enables and outputs the oscillation detection signal J, and the reset generation circuit 203 which generates the hard reset signal K for resetting the ΔΣ A/D converter 100. Therefore, the internal state of the ΔΣ A/D converter can be reset only when the oscillation state is continued without excessively resetting the same when overflow temporarily occurs due to an influence of noise or the like, and thereby the ΔΣ A/D converter can be appropriately restored to the normally operable state from the oscillation state. Further, since the oscillation detection circuit automatically resets the internal state of the ΔΣ A/D converter when the oscillation detection circuit detects the oscillation state, it is not necessary for the microcomputer to frequently confirm the oscillation state of the ΔΣ A/D converter to reset the internal state of the ΔΣ A/D converter, resulting in an effect that the burden on the microcomputer can be reduced.

While in this first embodiment the oscillation detection period setting E and the oscillation threshold value setting F as the oscillation detection conditions are set from the microcomputer 101 so that the oscillation detection conditions can be arbitrarily changed, both the settings E and F may be previously set as constants. Also in this case, the same operation and effect as in the case of making the settings E and F from the microcomputer 101 can be obtained, and moreover, the circuit scale can be reduced as compared with the case of arbitrarily setting them from the microcomputer.

Embodiment 2

Figure 4:
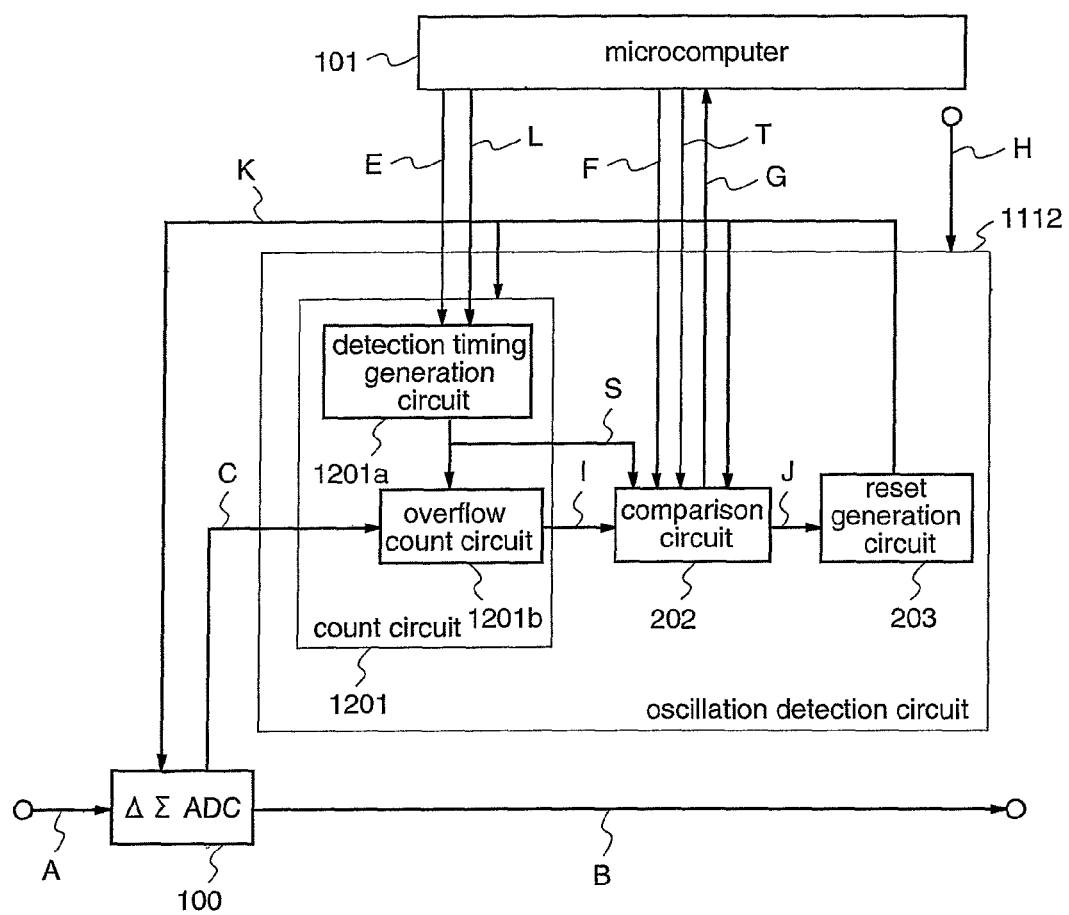
FIG. 4 is a block diagram illustrating an example of a semiconductor device according to a second embodiment of the present invention.

FIG. 4 is a block diagram illustrating a configuration example of a semiconductor device according to a second embodiment of the present invention.

The semiconductor device of this second embodiment includes a ΔΣ A/D converter 100 which converts an input analog data signal A into a digital data signal B, an oscillation detection circuit 1112 which detects the oscillation state of the ΔΣ A/D converter 100 by integrating an overflow detection signal C outputted from the ΔΣ A/D converter 100 after waiting a period of ΔΣ A/D converter stabilization wait setting L, and generates a ΔΣ A/D converter hard reset signal K, and a microcomputer 101 which sets the oscillation detection conditions. The oscillation detection circuit 1112 includes a count circuit 1201 which counts the number of times the overflow detection signal C outputted from the ΔΣ A/D converter 100 is detected within a predetermined period after waiting the period of the ΔΣ A/D converter stabilization wait setting L, a comparison circuit 202 which compares the count value I outputted from the count circuit 1201 with the oscillation threshold value setting F, and a reset generation circuit 203 which generates a ΔΣ A/D converter hard reset signal K from an oscillation detection signal J outputted from the comparison circuit 202. The count circuit 1201 includes a detection timing generation circuit 1201a which generates a detection timing signal S indicating the timing of overflow detection on the basis of the ΔΣ A/D converter stabilization wait setting L and the oscillation detection period setting E, and an overflow count circuit 1201b which counts the number of times the overflow detection signal C is detected within the predetermined period. The oscillation detection period setting E and the ΔΣ A/D converter stabilization wait setting L are supplied from the microcomputer 101 to the detection timing generation circuit 1201a, and the detection timing signal S is outputted from the detection timing generation circuit 1201a to the overflow count circuit 1201b and to the comparison circuit 202. The overflow count circuit 1201 receives the overflow detection signal C from the ΔΣ A/D converter 100, counts the number of times the overflow detection signal C is detected within the period of the oscillation detection period setting E after waiting the period of the ΔΣ A/D converter stabilization wait setting L on the basis of the detection timing signal S, and outputs the count value I to the comparison circuit 202. The ΔΣ A/D converter stabilization wait setting L is determined based on the time required until the ΔΣ A/D converter 100 is stabilized, which has previously been obtained, and the ΔΣ A/D converter stabilization waiting is started when the oscillation detection circuit reset H is released or when the hard reset signal K is released after generated.

The ΔΣ A/D converter 100 and the microcomputer 101 are identical to those of the conventional semiconductor device. The comparison circuit 202 and the reset generation circuit 203 in the oscillation detection circuit 1112 are identical to those of the first embodiment.

Figure 5:
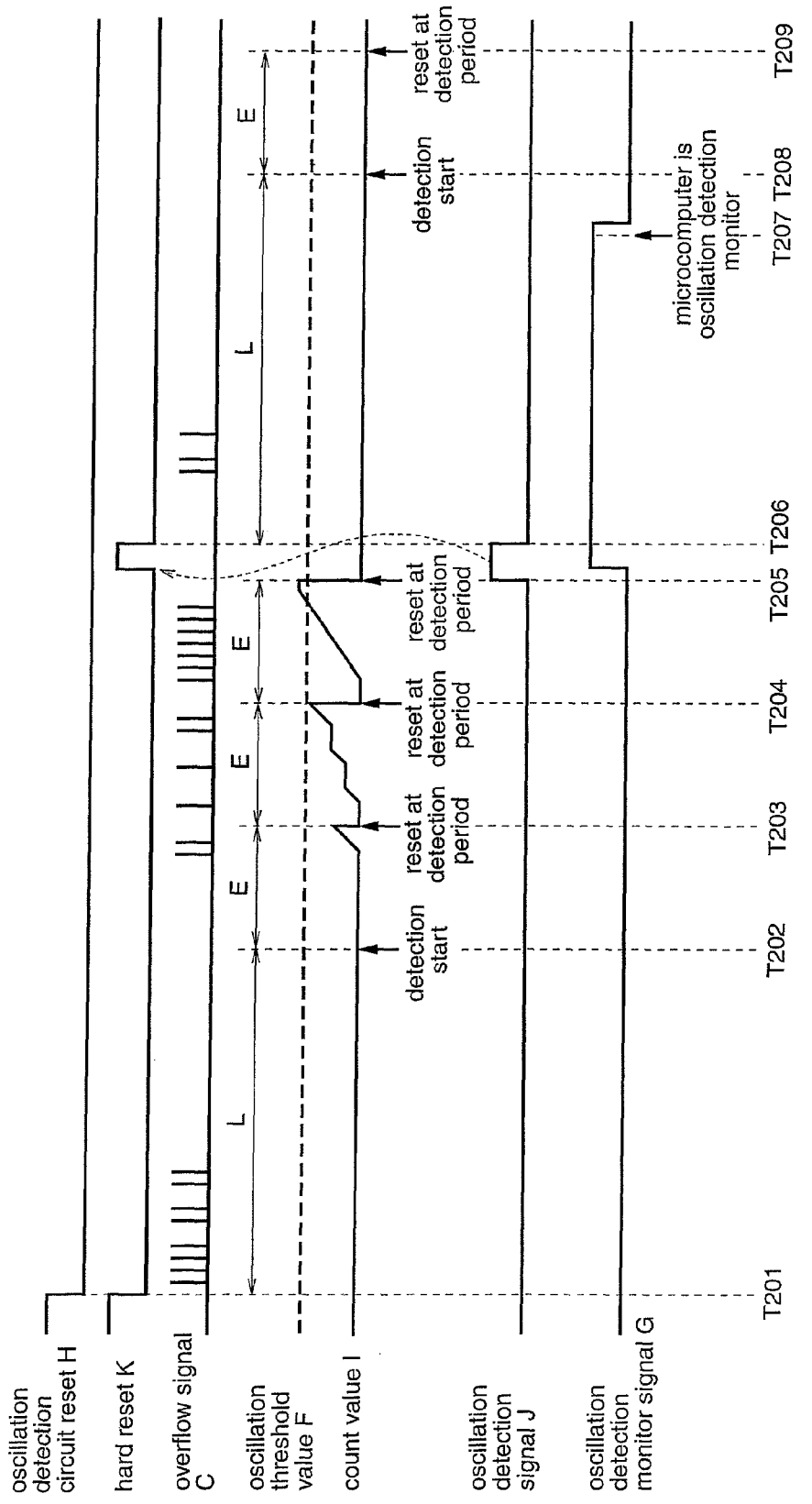
FIG. 5 is a timing chart of the semiconductor device of the second embodiment shown in FIG. 4.

FIG. 5 is a timing chart of the oscillation detection for the ΔΣ A/D converter in the semiconductor device of the second embodiment shown in FIG. 4. The operation of detecting the oscillation state of the ΔΣ A/D converter will be described with reference to FIG. 5.

The microcomputer 101 sets the oscillation detection period setting E and the ΔΣ A/D converter stabilization wait setting L in the count circuit 1201 in the oscillation detection circuit 1112, and sets the oscillation threshold value setting F in the comparison circuit 202 in the oscillation detection circuit 1112. In the count circuit 1201, after waiting the period of the ΔΣ A/D converter stabilization wait setting L until the ΔΣ A/D converter 100 is stabilized (timing T202) from when the oscillation detection circuit reset H was released (timing T201), the number of times the overflow detection signal C outputted from the ΔΣ A/D converter 100 shows the overflow state is counted for each period of the oscillation detection period setting E, and the count value I as the number of times is outputted to the comparison circuit 202. The count value I is reset for each period of the oscillation detection period setting E after waiting the period of the ΔΣ A/D converter stabilization wait setting L on the basis of the detection timing signal S (timings T203 to T205, T209). In the comparison circuit 202, the count value I is compared with the oscillation threshold value setting F for each period of the oscillation detection period setting E (timings T203 to T205, T209) after waiting the period of the ΔΣ A/D converter stabilization wait setting L on the basis of the detection timing signal S, and when the count value I is larger than the oscillation threshold value setting F (timing T205), the oscillation detection signal J is set to "H" and outputted to the reset generation circuit 203. In the reset generation circuit 203, a ΔΣ A/D converter hard reset signal K is generated so as to reset the internal state of the ΔΣ A/D converter 100 when the oscillation detection signal J becomes "H", and the hard reset signal K is outputted to the ΔΣ A/D converter 100. Further, the hard reset signal K outputted from the reset generation circuit 203 is input to the comparison circuit 202, and the oscillation detection signal J is restored to "L" by the hard reset signal K to wait for next oscillation detection. Further, the hard reset signal K outputted from the reset generation circuit 203 is input to the count circuit 1201, and the ΔΣ A/D converter stabilization waiting is restarted when the hard reset signal K is released (timing T206), and a next oscillation detection period is started after the period of the ΔΣ A/D converter stabilization wait setting L has passed (timing T208).

It is desired that an oscillation detection monitor signal G should be outputted to the microcomputer 101 so that the microcomputer 101 can confirm that the oscillation detection circuit 1112 has reset the internal state of the ΔΣ A/D converter 100. To be specific, when the oscillation detection signal J becomes "H" (timing T205), the oscillation detection monitor signal G is set to "H". When the microcomputer 101 reads out the oscillation detection monitor signal G and confirms the oscillation state of the ΔΣ A/D converter 100 (timing T207), the microcomputer 101 outputs an oscillation detection monitor signal clear signal T to the comparison circuit 202 to set the oscillation detection monitor signal G to "L", and thereby the microcomputer 101 can surely confirm that the oscillation detection circuit 1112 has reset the ΔΣ A/D converter 100.

According to this second embodiment, in the semiconductor device shown in FIG. 4, it is judged that the ΔΣ A/D converter 100 is in the oscillation state when the number of overflow detections within the period of the oscillation detection period setting E after waiting the period of the ΔΣ A/D converter stabilization wait setting L from when the overflow detection signal C has been outputted is equal to or larger than the threshold value. However, in the semiconductor device shown in FIG. 1, the operations of the overflow detection circuit 5, the overflow frequency calculation circuit 6, the oscillation judgment circuit 7, and the oscillation halt circuit 8 may be kept stand-by until the ΔΣ A/D converter 13 is stabilized.

More specifically, in the semiconductor device shown in FIG. 1, immediately after the start-up or after the oscillation halt circuit 8 tries to restore the operation to the stable state, the state where the output amplitudes of the integrators 2, 3, and 4 are large might be continued during the transition period to the stable state and thereby the ΔΣ modulator 13 might be judged as being in the oscillation state, and then the oscillation halt circuit 8 again tries to restore the operation to the stable state. If such state is continued, the oscillation halt circuit 8 continuously tries to restore the operation to the stable state, which leads to a fear that the ΔΣ modulation might not be normally carried out. So, immediately after the start-up or after the oscillation halt circuit 8 tries to return the operation to the stable state, the overflow detection circuit 5 does not output the overflow detection signal until the E modulator 13 is stabilized. Alternatively, immediately after the start-up or after the oscillation halt circuit 8 tries to return the operation to the stable state, the overflow frequency calculation circuit 6 does not output the overflow frequency value until the ΔΣ modulator 13 is stabilized. Alternatively, immediately after the start-up or after the oscillation halt circuit 8 tries to return the operation to the stable state, the oscillation judgment circuit 7 does not judge the oscillation until the ΔΣ modulator 13 is stabilized. Alternatively, immediately after the start-up or after the oscillation halt circuit 8 tries to return the operation to the stable state, the oscillation halt circuit 8 does not try to return the operation to the stable state until the ΔΣ modulator 13 is stabilized. In the operation stage of at least one of the overflow detection circuit 5, the overflow frequency calculation circuit 6, the oscillation judgment circuit 7, and the oscillation halt circuit 8, the operation thereof is kept stand-by until the ΔΣ modulator 13 is stabilized, immediately after the start-up or after the oscillation halt circuit 8 tries to return the operation to the stable state.

As described above, the semiconductor device of this second embodiment is provided with the oscillation detection circuit 1112 including the count circuit 1201 which counts the number of times the overflow detection signal C is detected within the period of the oscillation detection period setting E after waiting the period of the ΔΣ A/D converter stabilization wait setting L, and outputs the count value I, the comparison circuit 202 which compares the count value I with the oscillation threshold value setting F, and judges that the ΔΣ A/D converter 100 is in the oscillation state when the number of overflow detections within the period of the oscillation detection period setting E after waiting the period of the ΔΣ A/D converter stabilization wait setting L is equal to or larger than the threshold value, and then enables and outputs the oscillation detection signal J, and the reset generation circuit 203 which receives the oscillation detection signal J, and generates the hard reset signal K for resetting the ΔΣ A/D converter 100. Therefore, similarly to the first embodiment, the internal state of the ΔΣ A/D converter is reset only when the oscillation state is continued, and thereby the ΔΣ A/D converter can be appropriately restored from the oscillation state. Further, it is not necessary for the microcomputer to frequently confirm the state of the ΔΣ A/D converter to reset the oscillation state of the ΔΣ A/D converter, and thereby the burden on the microcomputer can be reduced.

Further, according to the second embodiment, since the ΔΣ A/D converter stabilization wait setting L is set in the count circuit 1201 in the oscillation detection circuit 1112 so as not to perform counting of the number of overflow detections until the ΔΣ A/D converter is stabilized, it is possible to prevent the ΔΣ A/D converter from being reset while the ΔΣ A/D converter is unstable.

Furthermore, while in this second embodiment the oscillation detection period setting E, the oscillation threshold value setting F, and the ΔΣ A/D converter stabilization wait setting L as the oscillation detection conditions are set from the microcomputer 101 so that the oscillation detection conditions can be arbitrarily changed, the settings E, F, and L may be previously set as constants. Also in this case, the same operation and effect as in the case of making the settings E, F, and L from the microcomputer 101 can be obtained, and moreover, the circuit scale can be reduced as compared with the case of arbitrarily setting them from the microcomputer.

Embodiment 3

Figure 6:
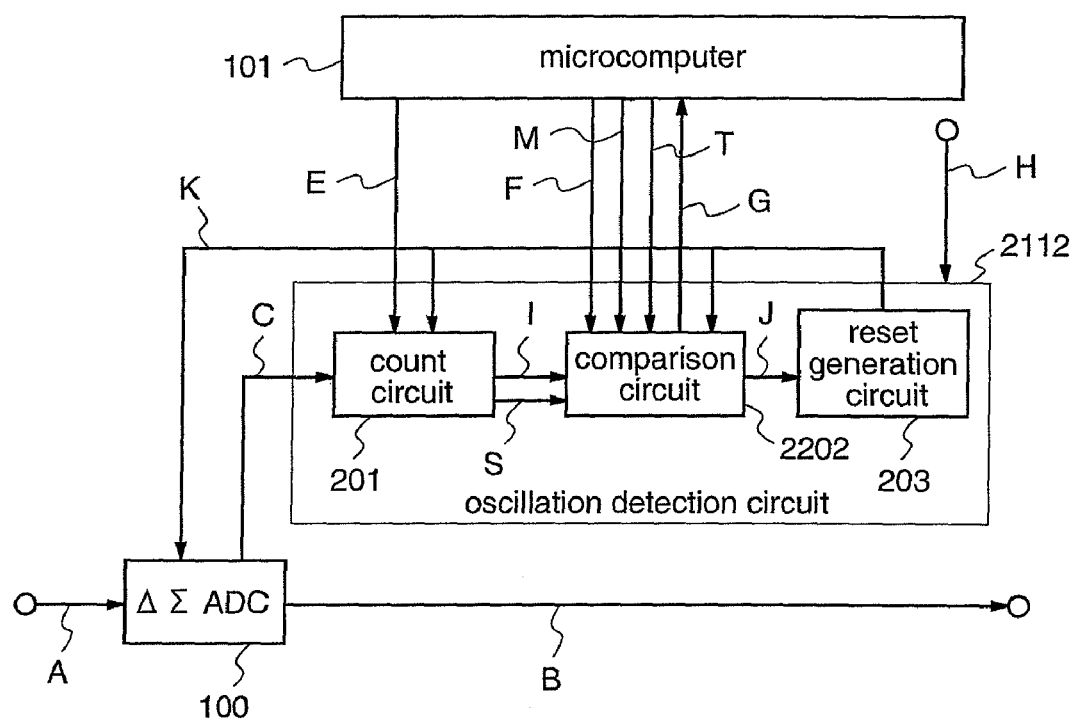
FIG. 6 is a block diagram illustrating an example of a semiconductor device according to a third embodiment of the present invention.

FIG. 6 is a block diagram illustrating a configuration example of a semiconductor device according to a third embodiment of the present invention.

The semiconductor device of this third embodiment includes a ΔΣ A/D converter 100 which converts an input analog data signal A into a digital data signal B, an oscillation detection circuit 2112 which detects the oscillation state of the ΔΣ A/D converter 100 by integrating an overflow detection signal C outputted from the ΔΣ A/D converter 100 to generate a ΔΣ A/D converter hard reset signal K, and a microcomputer 101 which sets the oscillation detection conditions. The oscillation detection circuit 2112 includes a count circuit 201 which counts the number of times the overflow detection signal C outputted from the ΔΣ A/D converter 100 is detected within a predetermined period, a comparison circuit 2202 which counts the result obtained by comparing the count value I outputted from the count circuit 201 with the oscillation threshold value setting F, and compares the count result with the number of continuous oscillation detections setting M, and a reset generation circuit 203 which generates a ΔΣ A/D converter hard reset signal K on the basis of the oscillation detection signal J outputted from the comparison circuit 202.

The ΔΣ A/D converter 100 and the microcomputer 101 are identical to those of the conventional semiconductor device.

The count circuit 201 and the reset generation circuit 203 in the oscillation detection circuit 2112 are identical to those of the first embodiment.

Figure 7:
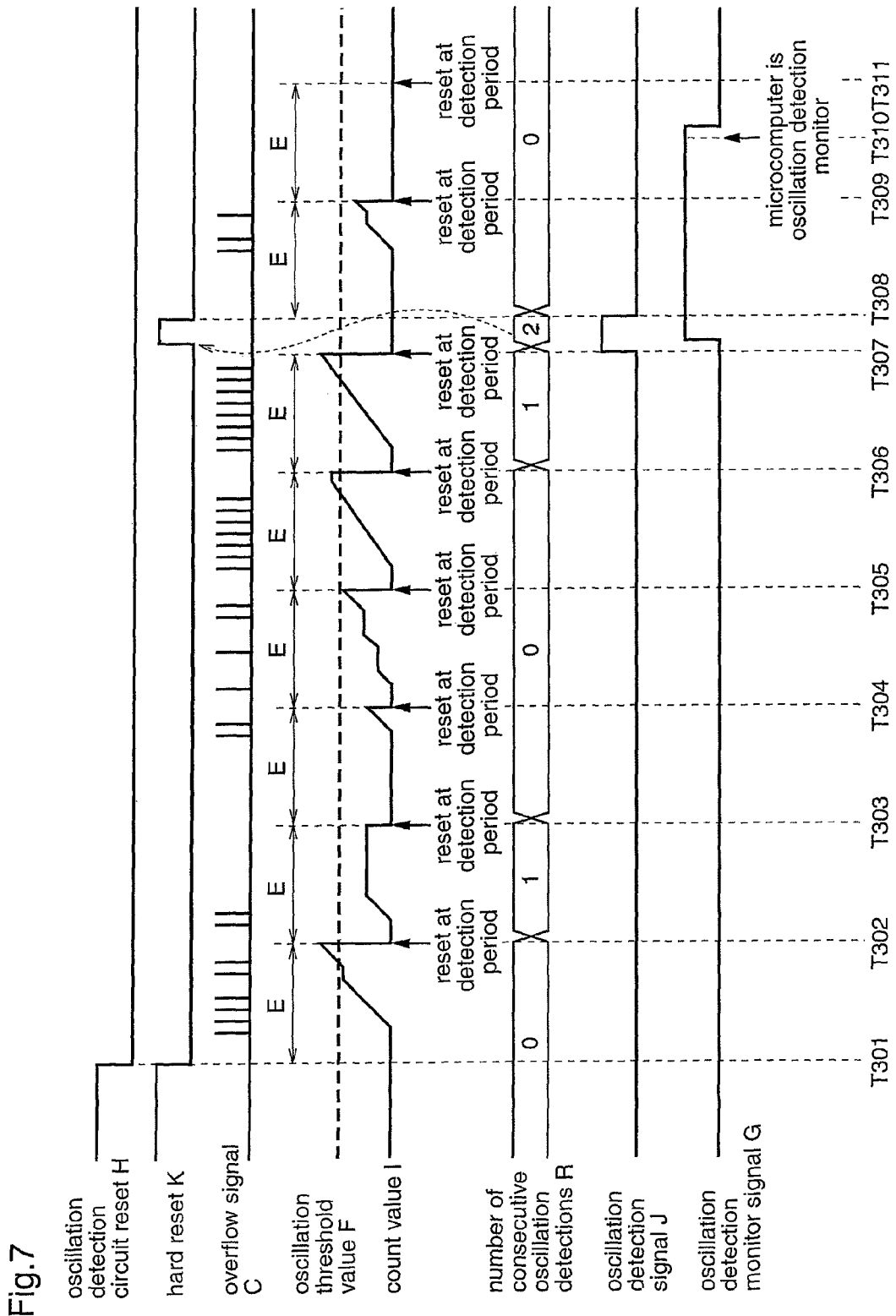
FIG. 7 is a timing chart of the semiconductor device of the third embodiment shown in FIG. 6.

FIG. 7 is a timing chart of oscillation detection for the ΔΣ A/D converter in the case where the number of continuous oscillation detections setting M is 2 in the semiconductor device of the third embodiment shown in FIG. 6. The operation of detecting the oscillation state of the ΔΣ A/D converter will be described with reference to FIG. 7.

The microcomputer 101 sets the oscillation detection period setting E in the count circuit 201 in the oscillation detection circuit 2112 from the microcomputer 101, and sets the oscillation threshold value setting F and the number of continuous oscillation detections setting M in the comparison circuit 2202 in the oscillation detection circuit 2112. In the count circuit 201, after the oscillation detection circuit reset H is released (timing T301), the number of times the overflow detection signal C outputted from the ΔΣ A/D converter 100 shows the overflow state is counted for each period of the oscillation detection period setting E, and the count value I as the number of times is outputted to the comparison circuit 2202. The count value I is reset for each period of the oscillation detection period setting E on the basis of the detection timing signal S (timings T302 to T307, T309, T311).

In the comparison circuit 2202, the count value I is compared with the oscillation threshold value setting F for each period of the oscillation detection period setting E (timings T302 to T307, T309, T311) on the basis of the detection timing signal S, and the number of continuous oscillation detections R is incremented when the count value I is larger than the oscillation threshold value setting F (timings T302, T306, T307), while the number of continuous oscillation detections R is reset when the count value I is smaller than the oscillation threshold value setting F (timings T303, T304, T305, T309, T311). For example, since the count value I is larger than the oscillation threshold value setting F at timing T302, the number of continuous oscillation detections R is incremented to "1" from "0". However, at next timing T303, since the count value I is smaller than the oscillation threshold value setting F and the case where the count value I is larger than the oscillation threshold value setting F is not continued, the number of continuous oscillation detections R is reset to "0" from "1". When the number of continuous oscillation detections R becomes equal to or larger than the number of continuous oscillation detections setting M(=2) (timing T307), the oscillation detection signal J is set to "H" and outputted to the reset generation circuit 203.

In the reset generation circuit 203, a ΔΣ A/D converter hard reset signal K is generated so as to reset the internal state of the ΔΣ A/D converter 100 when the oscillation detection signal J becomes "H", and the hard reset signal K is outputted to the ΔΣ A/D converter 100. Further, the hard reset signal K outputted from the reset generation circuit 203 is also input to the comparison circuit 2202, and the number of continuous oscillation detections R is reset to "0" from "2" by the hard reset signal K, and the oscillation detection signal J is also returned to "L" by the hard reset signal K to wait for next oscillation detection. Further, the hard reset signal K outputted from the reset generation circuit 203 is input to the count circuit 201, and a next oscillation detection period is started when the hard reset signal K is released (timing T308).

It is desired that an oscillation detection monitor signal G should be outputted to the microcomputer 101 so that the microcomputer 101 can confirm that the oscillation detection circuit 2112 has reset the internal state of the ΔΣ A/D converter 100. To be specific, when the oscillation detection signal J becomes "H" (timing T307), the oscillation detection monitor signal G is set to "H". When the microcomputer 101 reads out the oscillation detection monitor signal G and confirms the oscillation state of the ΔΣ A/D converter 100 (timing T310), the microcomputer 101 outputs an oscillation detection monitor signal clear signal T to the comparison circuit 202 to set the oscillation detection monitor signal G to "L", and thereby the microcomputer 101 can surely confirm that the oscillation detection circuit 2112 has reset the ΔΣ A/D converter 100.

In this third embodiment, it is judged that the ΔΣ A/D converter is in the oscillation state only when the state where the number of overflow detections becomes equal to or larger than the threshold value is continued in the semiconductor device shown in FIG. 6. However, also in the semiconductor device shown in FIG. 1, the oscillation judgment circuit 7 may compare the overflow frequency value with the threshold value and judge that the ΔΣ modulator is in the oscillation state only when the case where the overflow frequency value becomes equal to or larger than the threshold value is continued. In this case, the overflow frequency calculation circuit 6 in the semiconductor device shown in FIG. 1 counts the number of times the overflow detection signal continuously shows the overflow state and outputs the count value (the number of times) as the overflow frequency value, and the count value is reset when the overflow detection signal does not show the overflow state.

As described above, the semiconductor device of this third embodiment is provided with the oscillation detection circuit 2112 having the count circuit 201 which counts the number of times the overflow detection signal C is detected within the period of the oscillation detection period setting E, and outputs the count value I, the comparison circuit 202 which compares the count value I with the oscillation threshold value setting F, and judges that the ΔΣ A/D converter 100 is in the oscillation state when the number of times by which the state where the number of overflow detections within the period of the oscillation detection period setting E becomes equal to or larger than the threshold value is continued becomes equal to or larger than the number of continuous oscillation detections setting M, and then enables and outputs the oscillation detection signal J, and the reset generation circuit 203 which receives the oscillation detection signal J, and generates the hard reset signal K for resetting the ΔΣ A/D converter 100. Therefore, it is possible to prevent the ΔΣ A/D converter from being unexpectedly reset by judging that the ΔΣ A/D converter is in the oscillation state only when the state where the number of overflow detections becomes equal to or larger than the threshold value is continued.

Further, while in this third embodiment the oscillation detection period setting E, the oscillation threshold value setting F, and the number of continuous oscillation detections setting M as the oscillation detection conditions are set from the microcomputer 101 so that the oscillation detection conditions can be arbitrarily varied, these settings E, F, and M may be previously set as constants. Also in this case, the same operation and effect as in the case where the settings E, F, and L are set from the microcomputer 101 are obtained, and moreover, the circuit scale can be reduced as compared with the case of arbitrarily setting them from the microcomputer.

Also in this third embodiment, as in the second embodiment, the number of overflow detections within the predetermined period after waiting until the ΔΣ A/D converter is stabilized may be counted with the ΔΣ A/D converter stabilization wait setting L being set in the count circuit in the oscillation detection circuit, and thereby the ΔΣ A/D converter is prevented from being reset while the ΔΣ A/D converter is unstable.

Embodiment 4

Figure 8:
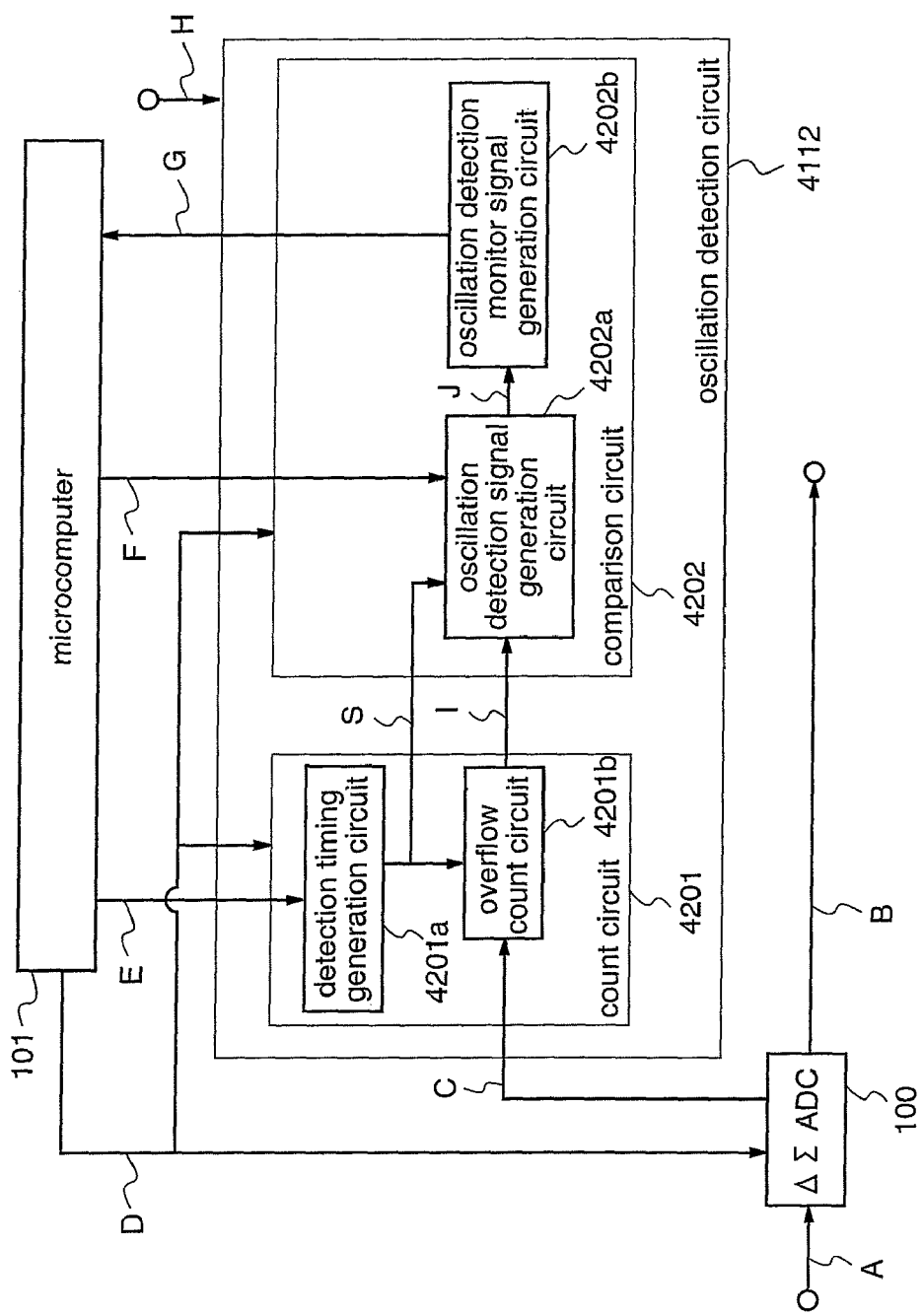
FIG. 8 is a block diagram illustrating an example of a semiconductor device according to a fourth embodiment of the present invention.

FIG. 8 is a block diagram illustrating a configuration example of semiconductor device according to a fourth embodiment of the present invention.

The semiconductor device of this fourth embodiment includes a $\Delta\Sigma$ A/D converter 100 which converts an input analog data signal A into a digital data signal B, an oscillation detection circuit 4112 which detects the oscillation state of the $\Delta\Sigma$ A/D converter 100 by integrating an overflow detection signal C outputted from the $\Delta\Sigma$ A/D converter 100, and a microcomputer 101 which confirms an oscillation detection monitor signal G outputted from the oscillation detection circuit 4112 to issue a $\Delta\Sigma$ A/D converter soft reset setting D to the $\Delta\Sigma$ A/D converter 100. The oscillation detection circuit 4112 includes a count circuit 4201 which counts the number of times the overflow detection signal C outputted from the $\Delta\Sigma$ A/D converter 100 is detected within a predetermined period, and a comparison circuit 4202 which compares the count value I outputted from the count circuit 4201 with the oscillation threshold value setting F. The count circuit 4201 includes a detection timing generation circuit 4201a which generates a detection timing signal S showing the timing of overflow detection on the basis of the oscillation detection period setting E, and an overflow count circuit 4201b which counts the number of times the overflow detection signal C is detected. The oscillation detection period setting E is supplied from the microcomputer 101 to the detection timing generation circuit 4201a, and the detection timing signal S is outputted from the detection timing generation circuit 4201a to the overflow count circuit 4201b and to the comparison circuit 4202. The overflow count circuit 4201b receives the overflow detection signal C from the $\Delta\Sigma$ A/D converter 100, counts the number of times the overflow detection signal C is detected within the period of the oscillation detection period setting E on the basis of the detection timing signal S, and outputs the count value I to the comparison circuit 4202. Further, the comparison circuit 4202 has an oscillation detection signal generation circuit 4202a which generates an oscillation detection signal J, and an oscillation detection monitor signal generation circuit 4202b which generates an oscillation detection monitor signal G. The oscillation detection signal J is supplied from the oscillation detection signal generation circuit 4202a to the oscillation detection monitor signal generation circuit 4202b, and the oscillation detection monitor signal G is outputted from the oscillation detection monitor signal generation circuit 4202b to the microcomputer 101.

The $\Delta\Sigma$ A/D converter 100 and the microcomputer 101 are identical to those of the conventional semiconductor device.

Figure 9:
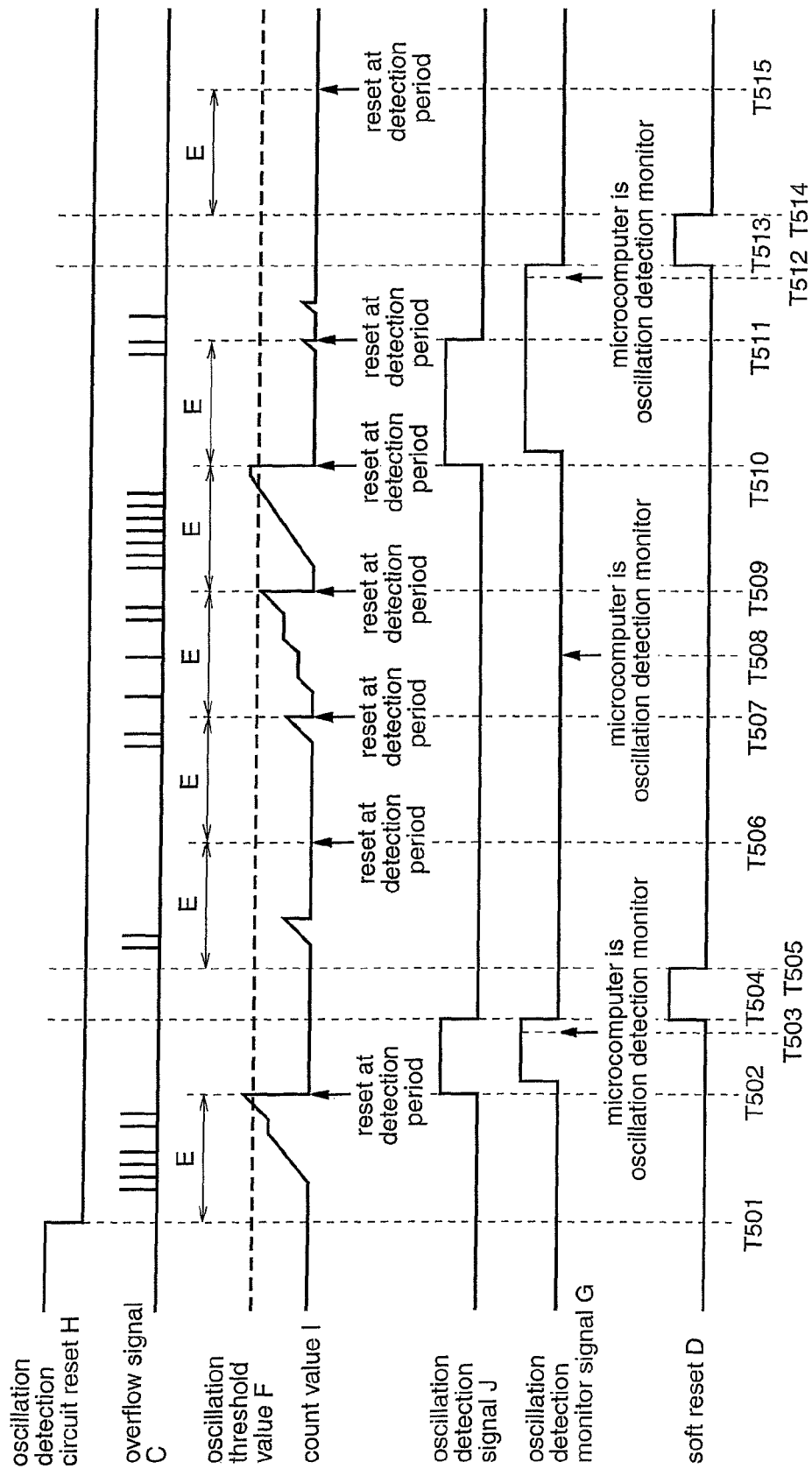
FIG. 9 is a timing chart of the semiconductor device of the fourth embodiment shown in FIG. 8.

FIG. 9 is a timing chart of oscillation detection for the $\Delta\Sigma$ A/D converter in the semiconductor device of the fourth embodiment shown in FIG. 8. The operation of detecting the oscillation state of the $\Delta\Sigma$ A/D converter will be described with reference to FIG. 9.

The microcomputer 101 sets the oscillation detection period setting E in the count circuit 4201 in the oscillation detection circuit 4112 from the microcomputer 101, and sets the oscillation threshold setting F in the comparison circuit 4202 in the oscillation detection circuit 4112. In the count circuit 4201, after the oscillation detection circuit reset H is released (timing T501), the number of times the overflow detection signal C outputted from the $\Delta\Sigma$ A/D converter 100 shows the overflow state is counted for each period of the oscillation detection period setting E, and the count value I as the number of times is outputted to the comparison circuit 202. The count value I is reset for each period of the oscillation detection period setting E on the basis of the detection timing signal S (timings T502, T506, T507, T509 to T511, T515). Further, the soft reset setting D is supplied from the microcomputer 101 to the count circuit 4201, and a next oscillation detection period is started when the soft reset setting D is released (timings T505, T514).

In the oscillation detection signal generator circuit 4202a in the comparison circuit 4202, the count value I is compared with the oscillation threshold setting F for each period of the oscillation detection period setting E (timings T502, T506, T509 to T511, T515) on the basis of the detection timing signal S, and when the count value I is larger than the oscillation threshold setting F (timings T502, T510), the oscillation detection signal J is set at "H" during the next oscillation detection period. In the oscillation detection monitor signal generator circuit 4202b in the comparison circuit 4202, when the oscillation detection signal J becomes "H", the oscillation detection monitor signal G is set to "H" and outputted to the microcomputer 101. Further, the soft reset setting D is supplied from the microcomputer 101 to the comparison circuit 4202, and the oscillation detection signal J and the oscillation detection monitor signal G are returned to "L" by the soft reset setting D to wait for next oscillation detection.

The microcomputer 101 periodically monitors the oscillation detection monitor signal G outputted from the oscillation detection circuit 4112 (timings T503, T508, T512), and when the oscillation detection monitor signal G shows the oscillation state of the $\Delta\Sigma$ A/D converter 100 (timings T503, T512), the microcomputer 101 issues the $\Delta\Sigma$ A/D converter soft reset setting D so as to reset the internal state of the $\Delta\Sigma$ A/D converter 100 (timings T504, T513).

During the oscillation detection period from timing T502, when the microcomputer 101 confirms that the oscillation detection monitor signal G shows the oscillation state of the $\Delta\Sigma$ A/D converter 100 at timing T503 before the period of the length of the oscillation detection period setting E is completed, the $\Delta\Sigma$ A/D converter soft reset setting D is supplied from the microcomputer 101 to the comparison circuit 202, and the oscillation detection signal J and the oscillation detection monitor signal G are returned to "L" at this timing (timing T504). Further, as described above, the oscillation detection signal J is set at "H" during the oscillation detection period from timing T510, and the oscillation detection signal J is returned to "L" at timing T511. During the oscillation detection period from timing T511, the oscillation detection monitor signal G is "H" until it is detected by the microcomputer 101. After detected by the microcomputer 101 (timing T512), it is set to "L" by the $\Delta\Sigma$ A/D converter soft reset setting D (timing T513).

While in this fourth embodiment the soft reset setting for resetting the $\Delta\Sigma$ A/D converter is transferred from the microcomputer to the $\Delta\Sigma$ A/D converter on the basis of the oscillation detection monitor signal in the semiconductor device shown in FIG. 8, the semiconductor device shown in FIG. 1 may be provided with the microcomputer as in the semiconductor device shown in FIG. 8, and the soft reset setting for resetting the $\Delta\Sigma$ modulator may be transferred from the microcomputer to the $\Delta\Sigma$ modulator on the basis of the oscillation detection monitor signal.

As described above, the semiconductor device of this fourth embodiment is provided with the oscillation detection circuit 4112 including the count circuit 4201 which counts the number of times the overflow detection signal C is detected within the period of the oscillation detection period setting E, and outputs the count value I, and the comparison circuit 4202 which compares the count value I with the oscillation threshold value setting F, and judges that the $\Delta\Sigma$ A/D converter 100 is in the oscillation state when the number of overflow detections within the period of the oscillation detection period setting E is equal to or larger than the threshold value, and then outputs the oscillation detection monitor signal G indicating that the ΔΣ A/D converter 100 is in the oscillation state to the microcomputer 101, and the microcomputer 101 transfers the soft reset setting D for resetting the ΔΣ A/D converter 100 to the ΔΣ A/D converter 100 on the basis of the oscillation detection monitor signal G. Therefore, as in the first embodiment, it is possible to restore the ΔΣ A/D converter from the oscillation state to the normally operable state by resetting the internal state of the ΔΣ A/D converter only when the oscillation state is continued.

While in this fourth embodiment the oscillation detection period setting E and the oscillation threshold value setting F as the oscillation detection conditions are set from the microcomputer 101 so that the oscillation detection conditions can be arbitrarily varied, the both settings E and F may be previously set as constants. In this case, the same operation and function as in the case of making the both settings E and F from the microcomputer 101 can be obtained, and moreover, the circuit scale can be reduced as compared with the case of arbitrarily setting them from the microcomputer.

While in this fourth embodiment the method of judging that the ΔΣ A/D converter is in the oscillation state when the number of overflow detections within the predetermined period is equal to or larger than the threshold value is adopted as the oscillation detection method as in the first embodiment, the method of judging that the ΔΣ A/D converter is in the oscillation state when the number of continuous overflow detections is equal to or larger than the threshold value may be adopted as in the fourth embodiment with the same effect as described above.

Further, by waiting until the ΔΣ A/D converter is stabilized with the ΔΣ A/D converter stabilization wait setting L being set in the counter circuit in the oscillation detection circuit as in the second embodiment, it is possible to prevent the ΔΣ A/D converter from being reset while the ΔΣ A/D converter is unstable.

Further, by judging that the ΔΣ A/D converter is in the oscillation state only when the state where the number of overflow detections is equal to or larger than the threshold value is continued as in the third embodiment, it is possible to prevent the ΔΣ A/D converter from being unexpectedly reset.

Embodiment 5

Figure 10:
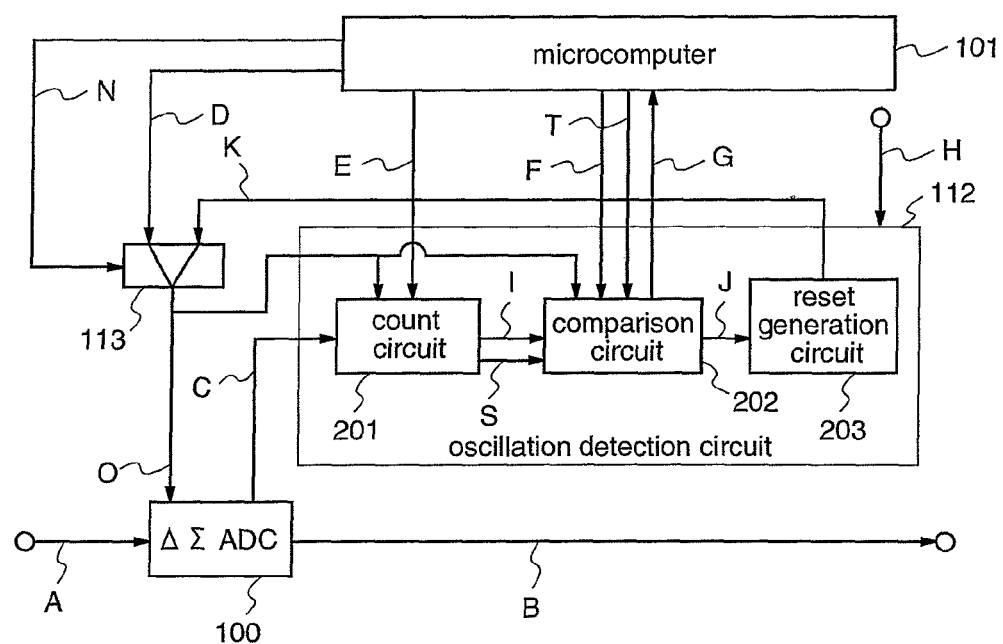
FIG. 10 is a block diagram illustrating an example of a semiconductor device according to a fifth embodiment of the present invention.

FIG. 10 is a block diagram illustrating a configuration example of a semiconductor device according to a fifth embodiment of the present invention.

The semiconductor device of this fifth embodiment includes a ΔΣ A/D converter 100 which converts an input analog data signal A into a digital data signal B, an oscillation detection circuit 112 which detects the oscillation state of the ΔΣ A/D converter 100 by counting the number of times the overflow detection signal C outputted from the ΔΣ A/D converter 100 is detected, and generates ΔΣ A/D converter hard reset signal K, a microcomputer 101 which confirms an oscillation detection monitor signal G outputted from the oscillation detection circuit 112 to issue a ΔΣ A/D converter soft reset setting D to the ΔΣ A/D converter 100, and a reset selection circuit 113 which selects either of the ΔΣ A/D converter hard reset signal K or the ΔΣ A/D converter soft reset signal D on the basis of a ΔΣ A/D converter hard reset enable setting N that is issued by the microcomputer 101. The oscillation detection circuit 112 includes a count circuit 201 which counts the number of times the overflow detection signal C outputted from the ΔΣ A/D converter 100 is detected, a comparison circuit 202 which compares the count value I outputted from the count circuit 201 with an oscillation threshold value setting F on the basis of a detection timing signal S outputted from the count circuit 201, and a reset generation circuit 203 which generates a ΔΣ A/D converter hard reset signal K from an oscillation detection signal J that is outputted from the comparison circuit 202.

The ΔΣ A/D converter 100 and the microcomputer 101 are identical to those of the conventional semiconductor device. Further, the oscillation detection circuit 112 of this fifth embodiment is identical to that of the first embodiment. While in this fifth embodiment the oscillation detection circuit is identical to that of the first embodiment, the oscillation detection circuit of the second or third embodiment may be used.

Next, the operation will be described. As for the same operation as that described in the first embodiment, description thereof will be omitted.

Initially, it is previously determined which one of the hard reset signal K and the soft reset signal D should be used according to the hard reset enable setting N supplied from the microcomputer 101.

The reset selection circuit 113 selects either of resetting the ΔΣ A/D converter 100 by the oscillation detection circuit 112 using the hard reset signal K as described in first to third embodiments or resetting the ΔΣ A/D converter 100 by the microcomputer 101 using the soft reset setting D as described in the fourth embodiment, according to the ΔΣ A/D converter hard reset enable setting N that is issued by the microcomputer 101, and outputs a ΔΣ A/D converter reset signal O to the ΔΣ A/D converter 100.

Further, the ΔΣ A/D converter reset signal O is supplied from the reset selection circuit 113 to the comparison circuit 202, and the oscillation detection signal J is returned to "L" by the ΔΣ A/D converter reset signal O. Further, the ΔΣ A/D converter reset signal O is supplied from the reset selection circuit 113 to the count circuit 201, and a next oscillation detection period is started when the ΔΣ A/D converter reset signal O is released.

When the oscillation detection circuit 112 resets the ΔΣ A/D converter 100, since the oscillation detection circuit 112 automatically resets the inner state of the ΔΣ A/D converter 100 when it detects the oscillation state, it is not necessary for the microcomputer 101 to frequently confirm the oscillation state of the ΔΣ A/D converter 100. However, when the semiconductor device is not configured such that resetting of the ΔΣ A/D converter 100 by the oscillation detection circuit 112 can be confirmed from the outside, even if the ΔΣ A/D converter 100 is frequently oscillated and therefore the oscillation detection condition and the input at the stage prior to the ΔΣ A/D converter 100 must be considered, there is a possibility that the operation of the ΔΣ A/D converter might be continued by continuously resetting the same. On the other hand, when the microcomputer 101 resets the ΔΣ A/D converter 100, since the microcomputer 101 always confirms the oscillation detection monitor signal G, the above-described problem hardly occurs. However, since the microcomputer 101 must frequently confirm the oscillation detection monitor signal G, the processing of the microcomputer 101 has a burden. Considering that the case of resetting the ΔΣ A/D converter 100 by the oscillation detection circuit 112 and the case of resetting the same by the microcomputer 101 have the different effects as described above, either of the ΔΣ A/D converter hard reset setting signal K or the ΔΣ A/D converter soft reset setting D is selected according to the usage condition of the semiconductor device.

While in this fifth embodiment the reset selection circuit can select either of the ΔΣ A/D converter hard reset setting signal K or the ΔΣ A/D converter soft reset setting D in the semiconductor device shown in FIG. 10, the semiconductor device shown in FIG. 1 may be provided with the microcomputer and the reset selection circuit so that the reset selection circuit can select either of the ΔΣ A/D converter hard reset setting signal K or the ΔΣ A/D converter soft reset setting D as in the semiconductor device shown in FIG. 10.

As described above, in the semiconductor device of this fifth embodiment, since the reset selection circuit 113 can select either of the ΔΣ A/D converter hard reset setting signal K or the ΔΣ A/D converter soft reset setting D, the internal state of the ΔΣ A/D converter can be reset by selecting either of resetting the ΔΣ A/D converter 100 by the oscillation detection circuit 112 or resetting the same by the microcomputer 101 according to the usage condition of the semiconductor device, and thereby the oscillation state of the ΔΣ A/D converter 100 can be appropriately restored.

Further, this fifth embodiment also has the effect of fail-safe which enables selection of normally operable reset when either of the reset generation circuit 203 in the oscillation detection circuit 112 or the ΔΣ A/D converter soft reset command from the microcomputer does not normally operate.

While in this fifth embodiment the same oscillation detection circuit 112 as used in the first embodiment is adopted as the oscillation detection circuit for detecting the oscillation state of the ΔΣ A/D converter 100, the same effect as described above can be obtained also when using the oscillation detection circuit 1112 of the second embodiment which judges that the ΔΣ A/D converter 100 is in the oscillation state when the number of overflow detections becomes equal to or larger than the threshold value after waiting until the ΔΣ A/D converter 100 is stabilized, or using the oscillation detection circuit 2112 of the third embodiment which judges that the ΔΣ A/D converter 100 is in the oscillation state when the number of continuous oscillation detections becomes equal to or larger than the set number of continuous oscillation detections.

Embodiment 6

Figure 11:
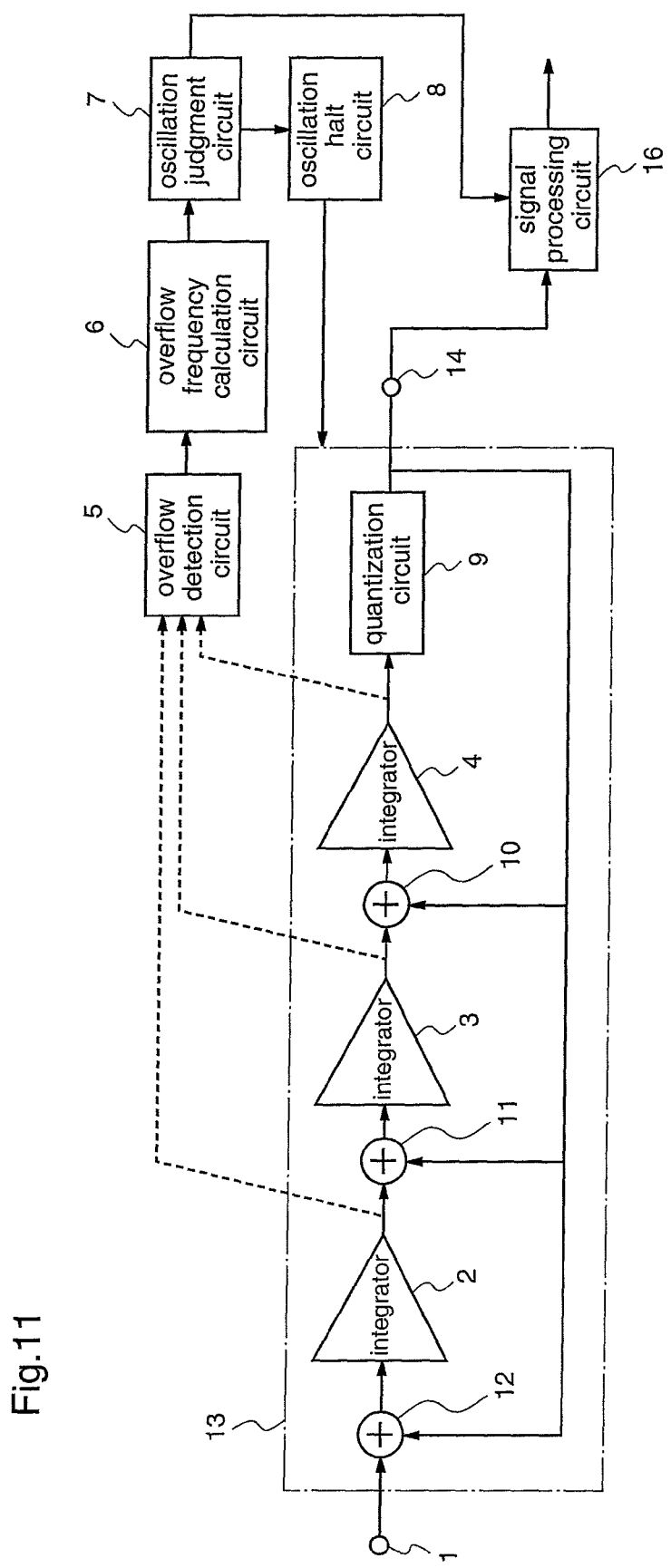
FIG. 11 is a block diagram illustrating a semiconductor device according to the fifth embodiment of the present invention.

FIG. 11 is a block diagram illustrating the configuration of a semiconductor system according to a sixth embodiment of the present invention. Since reference numerals 1 to 14 in FIG. 11 are identical to those in FIG. 1, repeated description is not necessary. The semiconductor system of this sixth embodiment is obtained by providing the semiconductor device of the first embodiment shown in FIG. 1 with a signal processing circuit 16.

In FIG. 11, reference numeral 16 denotes a signal processing circuit which processes a data signal outputted from the ΔΣ modulator 13. When the oscillation judgment circuit 7 judges that the ΔΣ modulator 13 is in the oscillation state, the signal processing circuit 16 performs a fade-out processing to reduce the influence of data discontinuity which is caused by resetting of the ΔΣ modulator 13, on the subsequent-stage signal processing. When the oscillation is suppressed, the signal processing circuit 16 performs a fade-in processing to reduce the influence of data discontinuity which is caused by resetting of the ΔΣ modulator 13, on the subsequent-stage signal processing.

When the oscillation judgment circuit 7 judges that the ΔΣ modulator 13 is oscillated, the signal processing circuit 16 may perform a process of turning off the data output to the outside, thereby to reduce the influence of data discontinuity due to resetting of the ΔΣ modulator 13 on the subsequent-stage signal processing.

Hereinafter, the configuration and operation will be described in detail.

A description will be given of an example of the semiconductor system of this sixth embodiment in which a count circuit is used as the overflow frequency calculation circuit 5 shown in FIG. 1, a comparison circuit as the oscillation judgment circuit 7, a reset generation circuit as the oscillation halt circuit 8, and a ΔΣ A/D converter as the Σ modulator 13.

Figure 12:
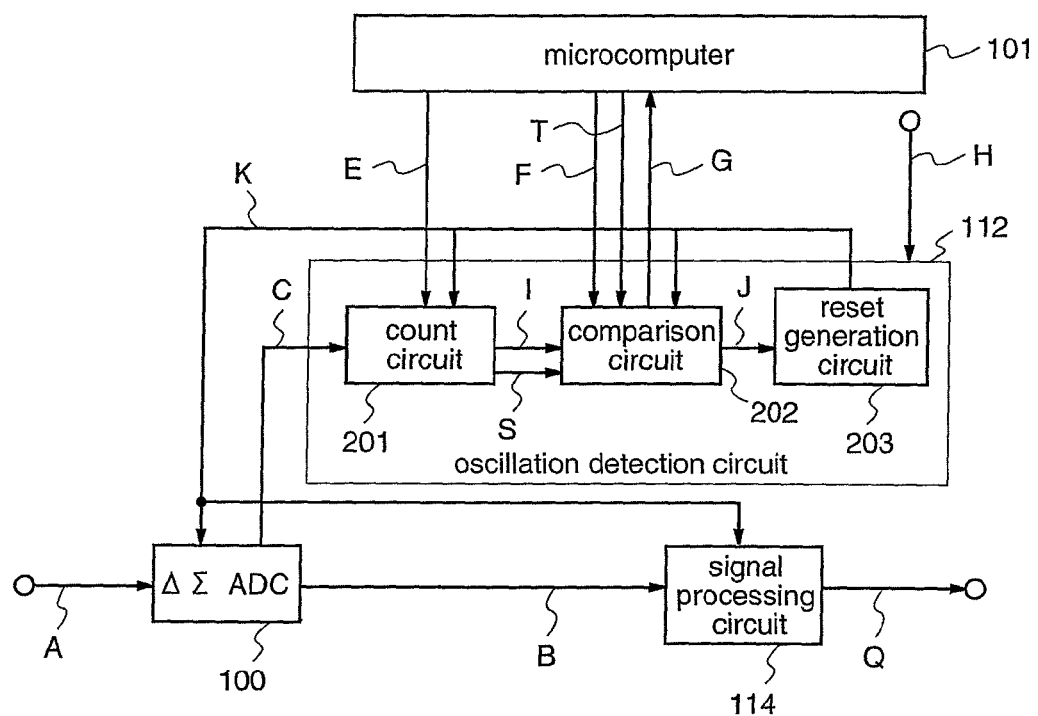
FIG. 12 is a block diagram illustrating an example of a semiconductor system according to a sixth embodiment of the present invention.

FIG. 12 is a block diagram illustrating the configuration of the example of the semiconductor system.

The semiconductor system of this sixth embodiment comprises a semiconductor device including ΔΣ A/D converter 100 which converts an input analog data signal A into a digital data signal B, an oscillation detection circuit 112 which detects the oscillation state of the ΔΣ A/D converter 100 by counting the number of times the overflow detection signal C outputted from the ΔΣ A/D converter 100 is detected, and a microcomputer 101 which confirms the oscillation detection monitor signal G outputted from the oscillation detection circuit 112, and a signal processing circuit 114 which processes the digital data signal B outputted from the ΔΣ A/D converter 100.

The ΔΣ A/D converter 100 and the microcomputer 101 of this sixth embodiment are identical to those of the conventional semiconductor device. The oscillation detection circuit 112 of this sixth embodiment is identical to that of the first embodiment. The sixth embodiment is different from the first embodiment in that the ΔΣ A/D converter hard reset signal K outputted from the oscillation detection circuit 112 is input to the signal processing circuit 114 as well as to the ΔΣ A/D converter 100. While the oscillation detection circuit of this sixth embodiment is identical to that of the first embodiment, the oscillation detection circuit of any of the second to fifth embodiments may be adopted.

Next, the operation will be described. The same operation as that described in the first embodiment will not be described repeatedly.

Figure 13:
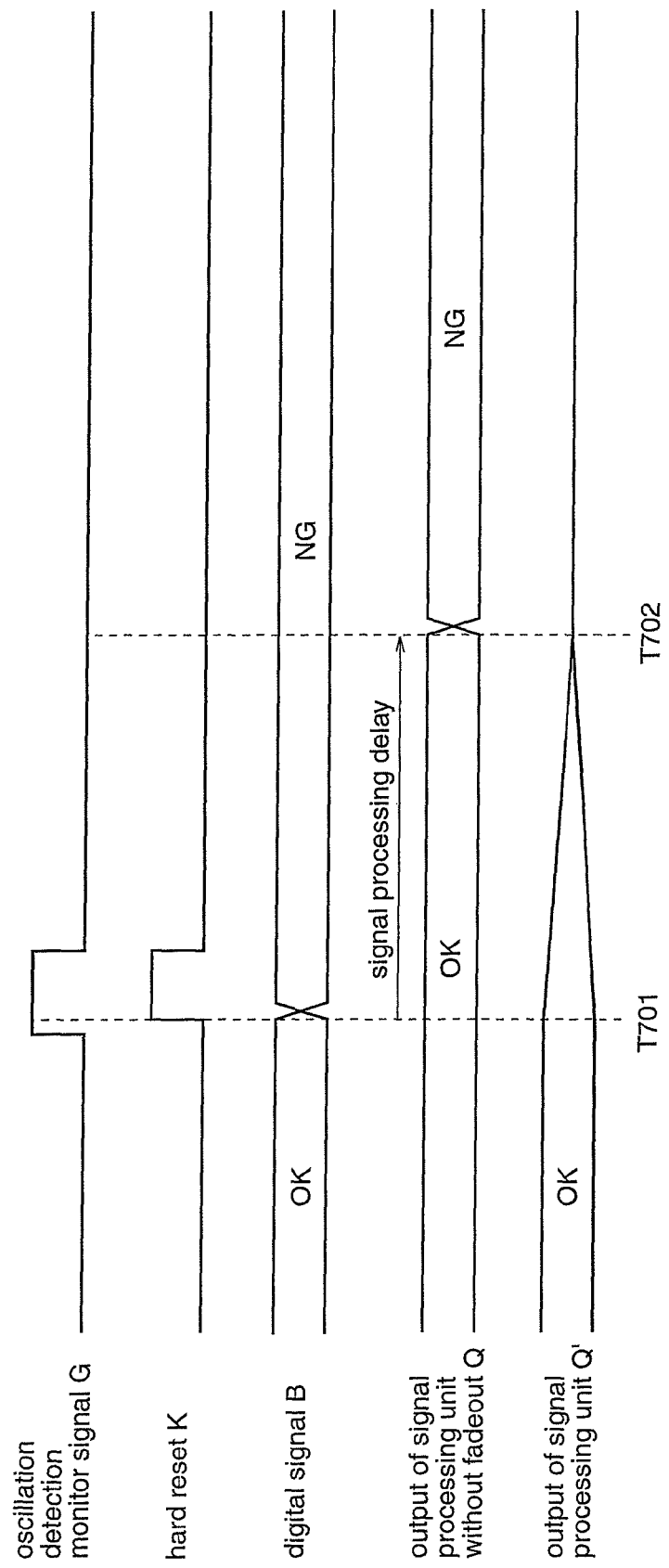
FIG. 13 is a timing chart of the semiconductor system of the sixth embodiment shown in FIG. 12.

FIG. 13 is a timing chart showing the oscillation state of the ΔΣ A/D converter and the signal processing in the semiconductor system of the sixth embodiment shown in FIG. 12.

In the semiconductor system of this sixth embodiment, as described in the first embodiment, the oscillation detection circuit 112 judges that the ΔΣ A/D converter 100 is in the oscillation state when the number of overflow detections within the period of the oscillation detection period setting E is equal to or larger than the oscillation threshold value setting F to detect the oscillation state of the ΔΣ A/D converter 100, and supplies the ΔΣ A/D converter hard reset signal K to the ΔΣ A/D converter 100 and to the signal processing circuit 114.

When the ΔΣ A/D converter 100 is reset by the ΔΣ A/D converter hard reset signal K, data discontinuity occurs in the digital data signal B outputted from the ΔΣ A/D converter 100 as shown in FIG. 13. When the digital data signal B outputted from the ΔΣ A/D converter 100 is input to the signal processing circuit 114 and processed, a signal processing delay usually occurs in the signal processing circuit 114.

In the case where the signal processing circuit 114 does not perform the fade-out processing, when the ΔΣ A/D converter 100 is oscillated (timing T701), data discontinuity due to resetting of the ΔΣ A/D converter occurs in the output Q of the signal processing circuit 114 at timing T702 which is delayed by the signal processing delay in the signal processing circuit 114. In order to avoid such data discontinuity, when the signal processing circuit 114 checks the ΔΣ A/D converter hard reset signal K to confirm that the ΔΣ A/D converter 100 will be reset (timing T701), it performs the fade-out processing so as to gradually mute the data by timing T702 at which the data discontinuity occurs.

At this time, the data of the digital data signal B is subjected to the fade-out processing to output Q' in the signal processing circuit 114 utilizing the period of the signal processing delay from timing T701 to timing T702 shown in FIG. 13, whereby the influence of the data discontinuity due to resetting of the ΔΣ A/D converter 100 on the outside is reduced, and discomfort due to the data discontinuity can be reduced.

As described above, the semiconductor system of this sixth embodiment is provided with the signal processing circuit 114 which checks the ΔΣ A/D converter hard reset signal K that is supplied from the oscillation detection circuit 112 in the semiconductor device, and performs the data fade-out processing when it confirms that the ΔΣ A/D converter 100 will be reset. Therefore, as in the first embodiment, the internal state of the ΔΣ A/D converter can be reset only when the oscillation state is continued, and thereby the ΔΣ A/D converter can be appropriately restored from the oscillation state to the normally operable state. Further, it is not necessary for the microcomputer to frequently confirm the oscillation state of the ΔΣ A/D converter 100 to reset the internal state of the ΔΣ A/D converter 100, and thereby the burden on the microcomputer can be reduced.

Further, according to the sixth embodiment, since the hard reset signal is supplied from the oscillation detection circuit in the semiconductor device to the signal processing circuit, the signal processing circuit in the stage subsequent to the ΔΣ A/D converter 100 can perform the fade-out processing before outputting discontinuous data to the outside on the assumption that data discontinuity might occur due to resetting of the ΔΣ A/D converter 100, and thereby the influence to the outside can be reduced.

While this sixth embodiment adopts the oscillation detection method of the first embodiment which judges that the ΔΣ A/D converter 100 is in the oscillation state when the number of overflow detections within the predetermined period is equal to or larger than the threshold value, it may adopt the oscillation detection method of the second embodiment which judges that the ΔΣ A/D converter 100 is in the oscillation state when the number of overflow detections after waiting until the ΔΣ A/D converter is stabilized is equal to or larger than the threshold value, or the oscillation detection method of the third embodiment which judges that the ΔΣ A/D converter 100 is in the oscillation state when the number of continuous overflow detections is equal to or larger than the set number of continuous overflow detections. Also in these cases, it is possible to reduce the influence to the outside by assuming data discontinuity which might occur due to resetting of the ΔΣ A/D converter, and performing the fade-out processing before outputting discontinuous data to the outside in the signal processing circuit placed in the stage subsequent to the ΔΣ A/D converter.

Furthermore, this sixth embodiment may adopt the oscillation detection method of the fourth embodiment which detects the oscillation state of the ΔΣ A/D converter and resets the ΔΣ A/D converter by the ΔΣ A/D converter soft reset setting supplied from the microcomputer, or the oscillation detection method the fifth embodiment which detects the oscillation state of the ΔΣ A/D converter and resets the ΔΣ A/D converter by the ΔΣ A/D converter reset signal which is switched between the hard reset signal from the oscillation detection circuit and the soft reset signal from the microcomputer. Also in these cases, it is possible to reduce the influence to the outside by assuming data discontinuity which might occur due to resetting of the ΔΣ A/D converter, and performing the fade-out processing before outputting discontinuous data to the outside in the signal processing circuit placed in the stage subsequent to the ΔΣ A/D converter.

Furthermore, according to the sixth embodiment, since the signal processing circuit 16 performs the fade-in processing for the output signal of the ΔΣ modulator after the oscillation is suppressed, it is possible to reduce the influence of data discontinuity due to resetting of the ΔΣ modulator 13 on the subsequent-stage signal processing.

Embodiment 7

Figure 14:
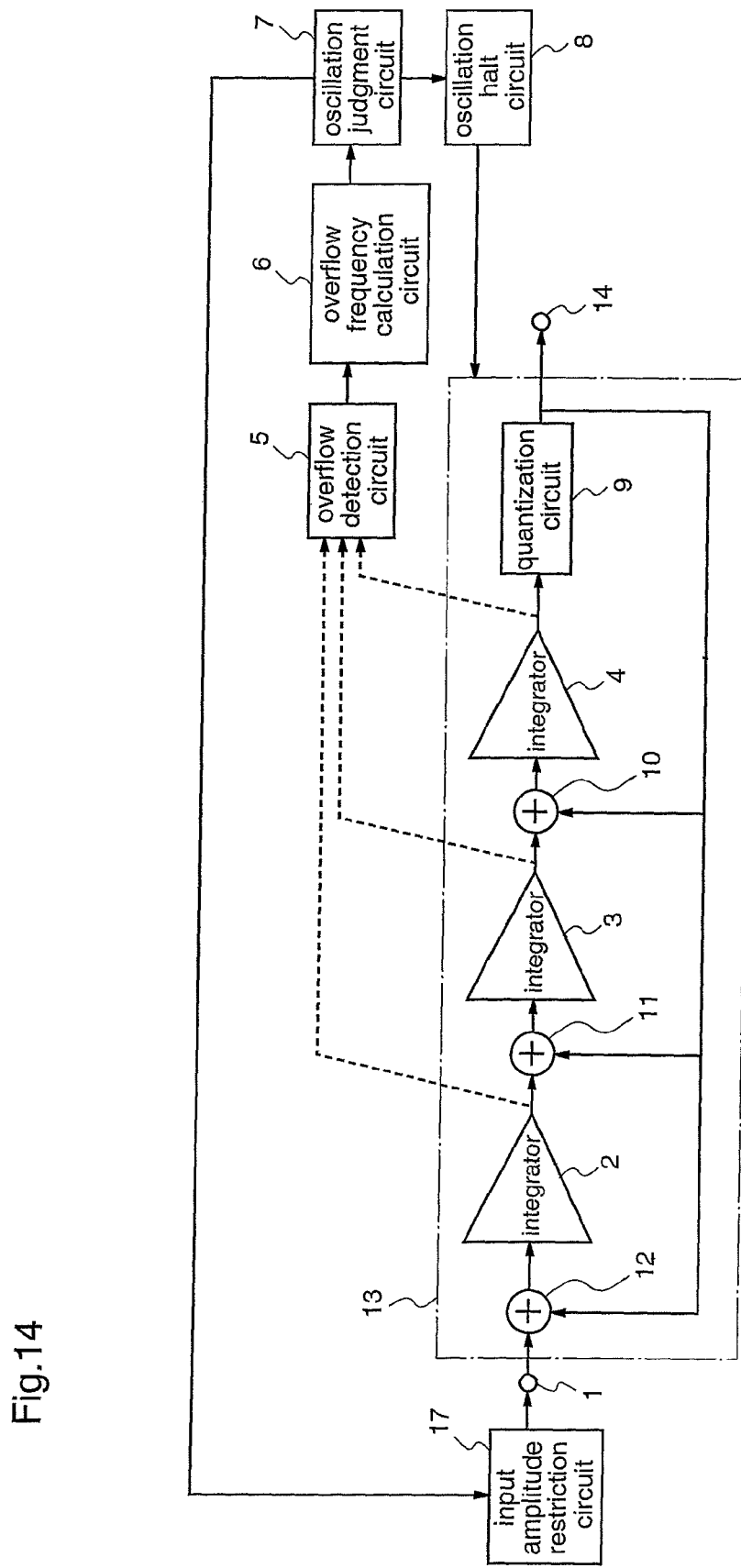
FIG. 14 is a block diagram illustrating a semiconductor system according to a seventh embodiment of the present invention.

FIG. 14 is a block diagram illustrating the configuration of a semiconductor system according to a seventh embodiment of the present invention. In FIG. 14, since reference numerals 1 to 14 are identical to those in FIG. 1, repeated description is not necessary. The semiconductor system of this seventh embodiment is obtained by providing the semiconductor device of the first embodiment shown in FIG. 1 with an input amplitude restriction circuit 17.

In FIG. 14, reference numeral 17 denotes an input amplitude restriction circuit which adjusts the input amplitude of an input data signal so as not to oscillate the ΔΣ modulator 13, and outputs the data signal to the ΔΣ modulator 13. When the oscillation judgment circuit 7 judges that the ΔΣ modulator 13 is in the oscillation state, the input amplitude restriction circuit 17 outputs the data with its input amplitude reduced. Since the ΔΣ modulator 13 being oscillated means that the input signal is large and thereby the modulator 13 is likely to be oscillated, the input amplitude is reduced to prevent the ΔΣ modulator 13 from being immediately oscillated again after the oscillation is suppressed.

Hereinafter, the configuration and operation will be described in detail.

A description will be given of an example of the semiconductor system of this seventh embodiment in which a count circuit is used as the overflow frequency calculation circuit 5 shown in FIG. 1, a comparison circuit as the oscillation judgment circuit 7, a reset generation circuit as the oscillation halt circuit 8, and a ΔΣ A/D converter as the ΔΣ modulator 13.

Figure 15:
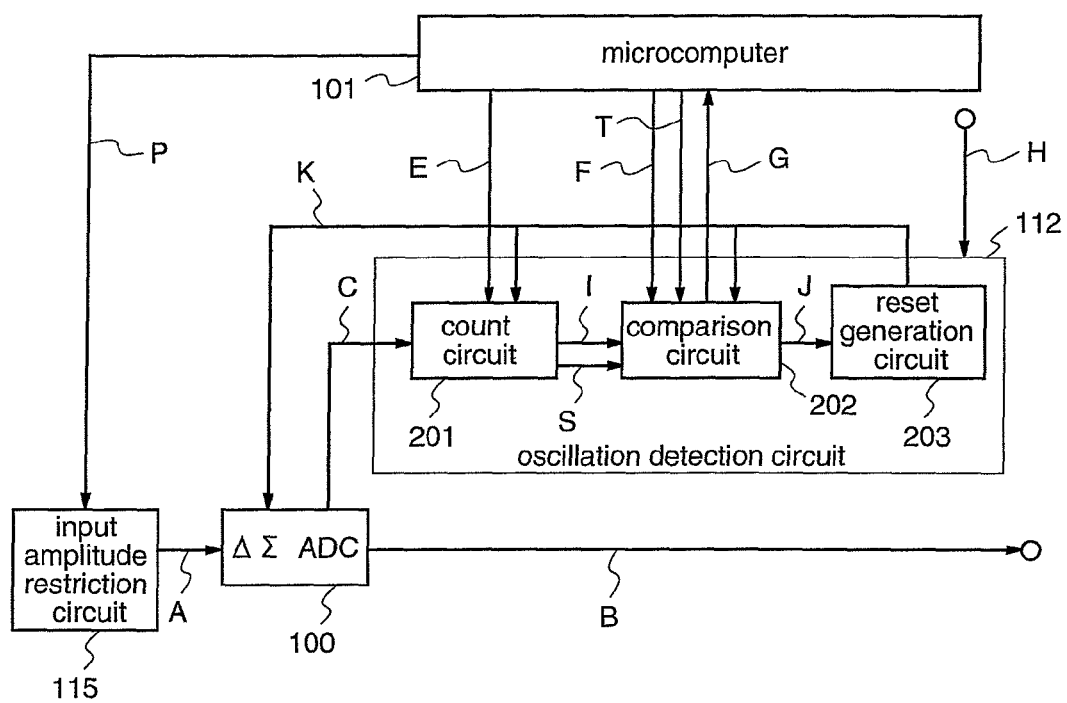
FIG. 15 is a block diagram illustrating an example of the semiconductor system of the seventh embodiment.

FIG. 15 is a block diagram illustrating the configuration of the example of the semiconductor system according to the seventh embodiment.

The semiconductor system of the seventh embodiment comprises a semiconductor device including a ΔΣ A/D converter 100 which converts an input analog data signal A into a digital data signal B, an oscillation detection circuit 112 which detects the oscillation state of the ΔΣ A/D converter 100 by counting the number of times the overflow detection signal C outputted from the ΔΣ A/D converter 100 is detected, and a microcomputer 101 which confirms the oscillation detection monitor signal G outputted from the oscillation detection circuit 112 and issues a ΔΣ A/D converter oscillation confirmation command P to an input amplitude restriction circuit 115, and the input amplitude restriction circuit 115 which adjusts the input amplitude of the input analog data signal A so as not to oscillate the ΔΣ A/D converter 100, and outputs the same to the ΔΣ A/D converter 100.

The ΔΣ A/D converter 100 and the microcomputer 101 of this seventh embodiment are identical to those of the conventional semiconductor device. The oscillation detection circuit 112 is identical to that of the first embodiment. The sixth embodiment is different from the first embodiment in that the ΔΣ A/D converter oscillation confirmation command P is transferred from the microcomputer 101 to the input amplitude restriction circuit 115, and the input amplitude restriction circuit 115 adjusts the input amplitude of the input analog data A and outputs the same to the ΔΣ A/D converter 100. While the oscillation detection circuit of this seventh embodiment is identical to that of the first embodiment, the oscillation detection circuit according to any of the second to fifth embodiments may be adopted.

Next, the operation will be described. The same operation as that described in the first embodiment will be omitted for its description.

In the semiconductor system of this seventh embodiment, as described in the first embodiment, the oscillation detection circuit 112 judges that the ΔΣ A/D converter 100 is in the oscillation state when the number of overflow detections within the period of the oscillation detection period setting E is equal to or larger than the oscillation threshold value setting F, thereby to detect the oscillation state of the ΔΣ A/D converter 100. The microcomputer 101 checks the oscillation detection monitor signal G outputted from the comparison circuit 202 in the oscillation detection circuit 112, and when the ΔΣ A/D converter 100 is in the oscillation state, the microcomputer 101 transfers the ΔΣ A/D converter oscillation confirmation command P to the input amplitude restriction circuit 115 to inform the oscillation state of the ΔΣ A/D converter 100. When the ΔΣ A/D converter 100 is being oscillated, the input amplitude restriction circuit 115 judges that the input analog data A exceeds the allowable range of the ΔΣ A/D converter 100, and outputs the input analog data A with its gain reduced to the ΔΣ A/D converter 100, and thereby the input analog data A is restricted within the allowable range of the ΔΣ A/D converter 100 to make the ΔΣ A/D converter 100 hard to be oscillated.

As described above, in the semiconductor system of this seventh embodiment, when the microcomputer 101 in the semiconductor device checks the oscillation detection monitor signal G and confirms that the ΔΣ A/D converter 100 is in the oscillation state, the microcomputer 101 transfers the ΔΣ A/D converter oscillation confirmation command P to the input amplitude restriction circuit 115, and then the input amplitude restriction circuit 115 reduces the input amplitude of the data and outputs the data when the ΔΣ A/D converter 100 is in the oscillation state. Therefore, as in the first embodiment, the internal state of the ΔΣ A/D converter can be reset only when the oscillation state is continued, and thereby the ΔΣ A/D converter can be appropriately restored from the oscillation state to the normally operable state. Further, since it is not necessary for the microcomputer to frequently confirm the oscillation state of the ΔΣ A/D converter to reset the internal state of the ΔΣ A/D converter, the burden on the microcomputer can be reduced.

Further, according to this seventh embodiment, by reducing the input gain of the ΔΣ A/D converter when oscillation of the ΔΣ A/D converter is detected, a system in which the ΔΣ A/D converter is not likely to oscillate can be realized.

While this seventh embodiment adopts the oscillation detection method of the first embodiment which judges that the ΔΣ A/D converter is in the oscillation state when the number of overflow detections within the predetermined period is equal to or larger than the threshold value, it may adopt the oscillation detection method of the second embodiment which judges that the ΔΣ A/D converter 100 is in the oscillation state when the number of overflow detections after waiting until the ΔΣ A/D converter is stabilized is equal to or larger than the threshold value, or the oscillation detection method of the third embodiment which judges that the ΔΣ A/D converter 100 is in the oscillation state when the number of continuous overflow detections is equal to or larger than the set number of continuous overflow detections. Also in these cases, it is possible to realize a system in which the ΔΣ A/D converter is not likely to oscillate by reducing the input gain of the ΔΣ A/D converter by the input amplitude restriction circuit.

Furthermore, this seventh embodiment may adopt the oscillation detection method of the fourth embodiment which detects the oscillation state of the ΔΣ A/D converter and resets the ΔΣ A/D converter by the ΔΣ A/D converter soft reset setting supplied from the microcomputer, or the oscillation detection method the fifth embodiment which detects the oscillation state of the ΔΣ A/D converter and resets the ΔΣ A/D converter by the ΔΣ A/D converter reset signal which is switched between the hard reset signal from the oscillation detection circuit and the soft reset signal from the microcomputer. Also in these cases, it is possible to realize a system in which the ΔΣ A/D converter is not likely to oscillate by reducing the input gain of the ΔΣ A/D converter by the input amplitude restriction circuit.

Embodiment 8

Figure 16:
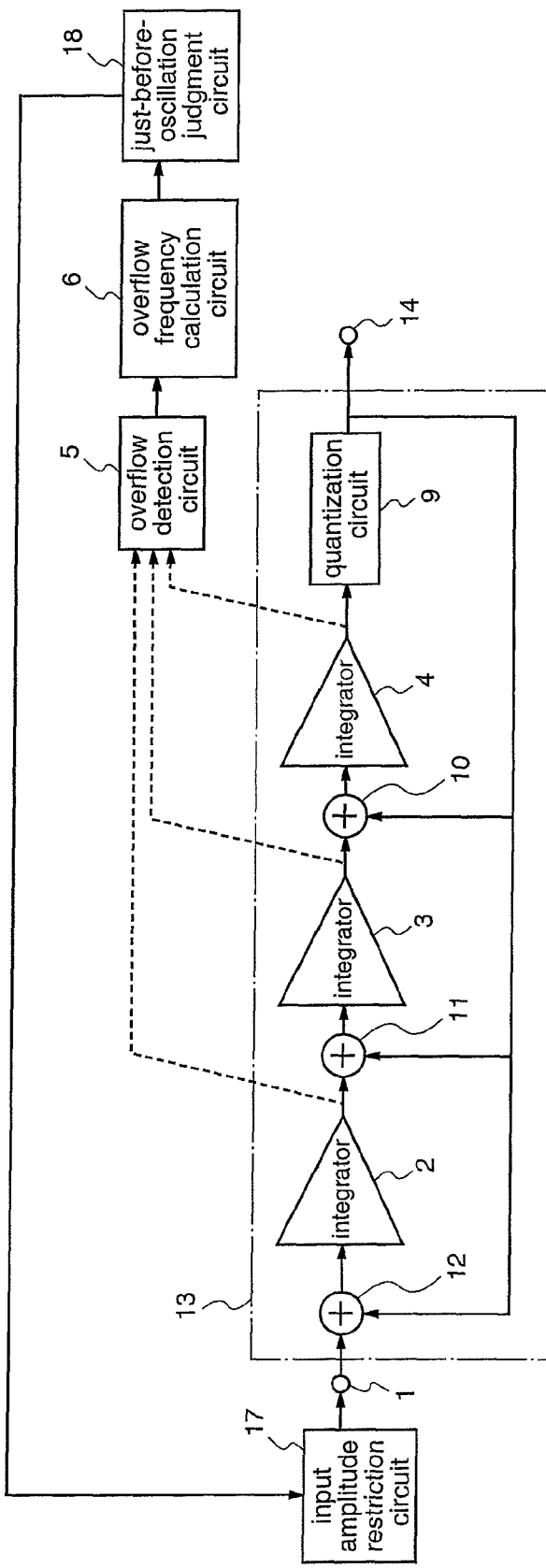
FIG. 16 is a block diagram illustrating a semiconductor system according to an eighth embodiment of the present invention.

FIG. 16 is a block diagram illustrating the configuration of a semiconductor system according to an eighth embodiment of the present invention. In FIG. 16, since reference numerals 1 to 6 and 9 to 14 are identical to those in FIG. 1 and reference numeral 17 is identical to that in FIG. 14, repeated description is not necessary. The semiconductor system of this eighth embodiment is obtained by providing the semiconductor device of the first embodiment shown in FIG. 1 with an input amplitude restriction circuit 17, and further, a just-before-oscillation judgment circuit 18 instead of the oscillation judgment circuit 7 and the oscillation halt circuit 8 shown in FIG. 1.

In FIG. 16, reference numeral 18 denotes a just-before-oscillation judgment circuit which compares the overflow frequency value with a reference value to judge whether the ΔΣ modulator 13 is in the state just before oscillation or not.

When the overflow detection circuit 5 compares the input signal with the reference value, the reference value in the overflow detection circuit 5 is compared with the reference value in the usual oscillation detection, and changed to a value within the range of the reference values obtained when no oscillation is detected. Thereby, even before oscillation of the ΔΣ modulator 13, when it comes near to be oscillated, the overflow detection circuit 5 outputs the overflow detection signal to the overflow frequency calculation circuit 6, and the just-before-oscillation judgment circuit 18 compares the overflow frequency value with the reference value to judge that the ΔΣ modulator 13 is just before oscillation. When the just-before-oscillation judgment circuit 18 judges that the ΔΣ modulator 13 is just before oscillation, it outputs the just-before-oscillation judgment signal to the input amplitude restriction circuit 17, and the input amplitude restriction circuit 17 reduces the input amplitude of the analog input signal, thereby avoiding oscillation of the ΔΣ modulator 13.

In order to detect the moment just before oscillation, the reference value to be compared with the analog input signal may be changed in the overflow detection circuit 5 as described above. However, it is also possible to detect the moment just before oscillation by lowering the reference value for judging oscillation in the just-before-oscillation judgment circuit 18 without changing the reference value in the overflow detection circuit 5. When the ΔΣ modulator 13 starts to oscillate, the output of the overflow frequency value from the overflow frequency calculation circuit 6 is less, and it is gradually increased. However, by changing the reference value of the just-before-oscillation judgment circuit 18 from 50 times to 30 times, the before-oscillation judgment circuit 18 can judge that the ΔΣ modulator 13 is just before oscillation when the ΔΣ modulator 13 comes near to oscillate.

Further, the semiconductor system of this eighth embodiment may be further provided with a microcomputer, and the reference value of the just-before-oscillation judgment circuit 18 and the reference value of the overflow detection circuit 5 may be changed according to an instruction from the microcomputer.

As described above, the semiconductor system of this eighth embodiment includes the just-before-oscillation judgment circuit 18 which judges whether the ΔΣ modulator 13 is in the state just before oscillation or not on the basis of the overflow frequency value, the overflow detection circuit 5 changes its predetermined value to a value within the range of the reference values obtained when no oscillation is detected, the overflow frequency calculation circuit 6 calculates the overflow frequency value on the basis of the overflow detection signal which is obtained by comparing the output from the integrator in the ΔΣ modulator 13 with the changed predetermined value by the overflow detection circuit 5, and the just-before-oscillation judgment circuit 18 detects the state of the ΔΣ modulator 13 at the moment just before oscillation. Therefore, although resetting is required when input restriction is performed after the ΔΣ modulator has been oscillated, it is not necessary to perform such resetting by performing input restriction for the ΔΣ modulator when it is judged that the ΔΣ modulator is at the moment just before oscillation to avoid oscillation. Further, it is possible to avoid discomfort in the oscillation state, such as noise in the case of a radio, by detecting that the ΔΣ modulator is at the moment just before oscillation and preventing oscillation of the ΔΣ modulator.

Embodiment 9

Figure 17:
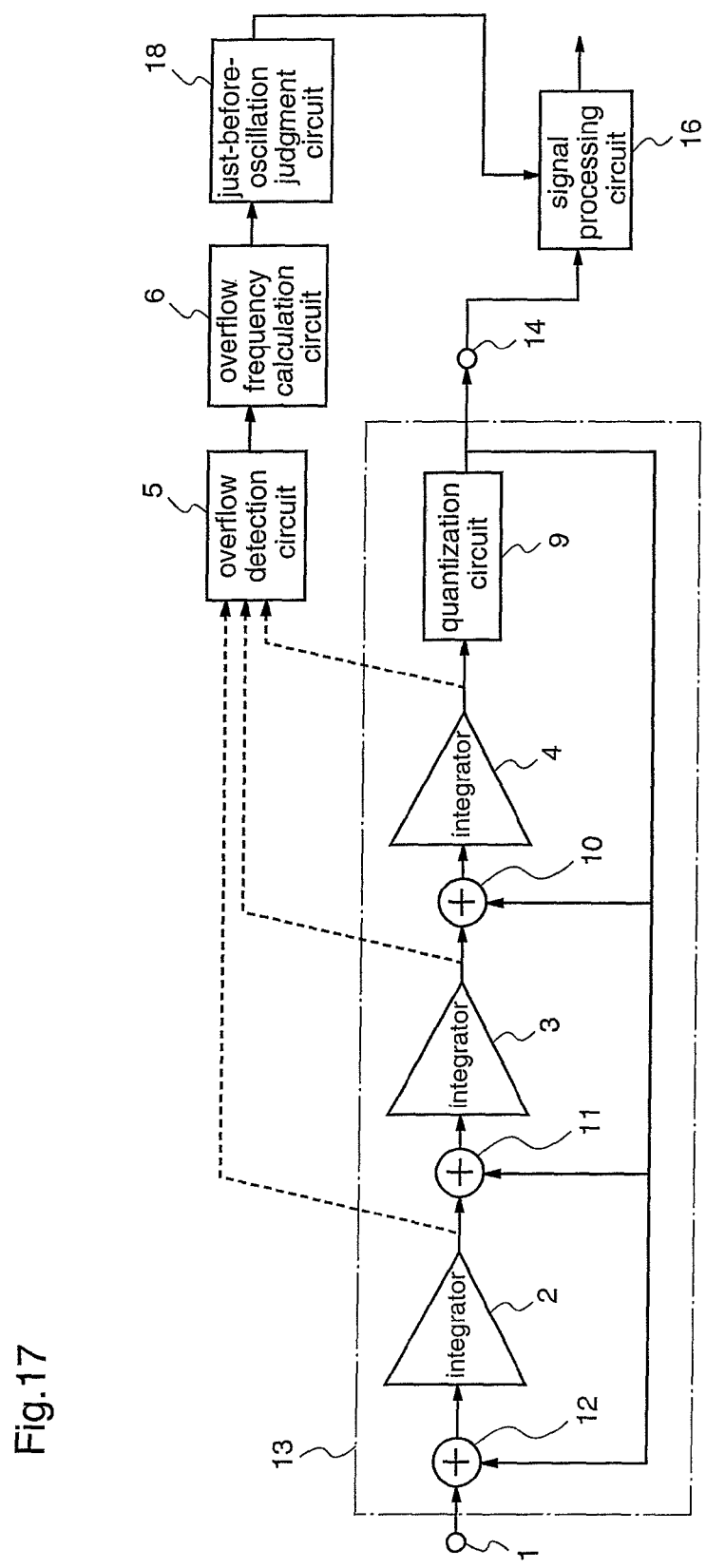
FIG. 17 is a block diagram illustrating a semiconductor system according to a ninth embodiment of the present invention.

FIG. 17 is a block diagram illustrating the configuration of a semiconductor system according to a ninth embodiment of the present invention. In FIG. 17, since the reference numerals 1 to 6 and 9 to 14 are identical to those in FIG. 1, the reference numeral 16 is identical to that in FIG. 11, and the reference numeral 18 is identical to that in FIG. 16, repeated description is not necessary. The semiconductor system of this ninth embodiment is obtained by providing the semiconductor device of the first embodiment shown in FIG. 1 with a signal processing circuit 16, and further, a just-before-oscillation judgment circuit 18 instead of the oscillation judgment circuit 7 and the oscillation halt circuit 8 shown in FIG. 1.

In FIG. 17, when the just-before-oscillation judgment circuit 18 judges that the ΔΣ modulator 13 is just before oscillation, a just-before-oscillation judgment signal is outputted to the signal processing circuit 16 and to the input amplitude restriction circuit 18.

When the overflow detection circuit 5 compares the input signal with the reference value, the reference value in the overflow detection circuit 5 is compared with the reference value in the usual oscillation detection, and changed to a value within the range of the reference values obtained when no oscillation is detected. Thereby, even before oscillation of the ΔΣ modulator 13, when it comes near to oscillate, the overflow detection circuit 5 outputs the overflow detection signal to the overflow frequency calculation circuit 6, and the just-before-oscillation judgment circuit 18 compares the overflow frequency value with the reference value to judge that the ΔΣ modulator 13 is just before oscillation. When the just-before-oscillation judgment circuit 18 judges that the ΔΣ modulator 13 is just before oscillation, it outputs the just-before-oscillation judgment signal to the signal processing circuit 16, and the signal processing circuit 16 performs the fade-out processing for the output signal from the ΔΣ modulator 13, thereby to reduce the influence of data discontinuity caused by oscillation of the ΔΣ modulator 13 on the subsequent-stage signal processing.

In order to detect the moment just before oscillation, the reference value to be compared with the analog input signal may be changed in the overflow detection circuit 5 as described above. However, it is also possible to detect the moment just before oscillation by lowering the reference value for judging oscillation in the just-before-oscillation judgment circuit 18 without changing the reference value in the overflow detection circuit 5.

The semiconductor system shown in FIG. 17 may further include an oscillation halt circuit 8, and the state of the ΔΣ modulator 13 just before oscillation may be suppressed by the oscillation halt circuit 8 when the just-before-oscillation judgment signal outputted from the just-before-oscillation judgment circuit 18 is input to the oscillation halt circuit 8.

Furthermore, the semiconductor system shown in FIG. 17 may further include a microcomputer, and the reference value of the just-before-oscillation judgment circuit 18 and the reference value of the overflow detection circuit 5 may be changed according to an instruction from the microcomputer.

As described above, the semiconductor system of this ninth embodiment includes the just-before-oscillation judgment circuit which judges whether the ΔΣ modulator 13 is in the state just before oscillation or not on the basis of the overflow frequency value, the overflow detection circuit 5 changes its predetermined value to a value within the range of the reference values obtained when no oscillation is detected, the overflow frequency calculation circuit 6 calculates the overflow frequency value on the basis of the overflow detection signal which is obtained by comparing the output from the integrator in the ΔΣ modulator 13 with the changed predetermined value by the overflow detection circuit 5, the just-before-oscillation judgment circuit 18 detects the state of the ΔΣ modulator 13 at the moment just before oscillation, and the signal processing circuit 16 performs the fade-out processing on the output of the ΔΣ modulator 13 when it is judged that the ΔΣ modulator 13 is in the state just before oscillation. Therefore, the influence of oscillation on the subsequent-stage signal processing can be reduced as in the sixth embodiment. Further, since the state of the ΔΣ modulator 13 at the moment just before oscillation is detected in this ninth embodiment, the influence of oscillation on the subsequent-stage signal processing can be reduced even when the signal processing delay in the signal processing circuit 16 is small, as compared with the case of performing the fade-out processing after oscillation is detected.

Embodiment 10

Figure 18:
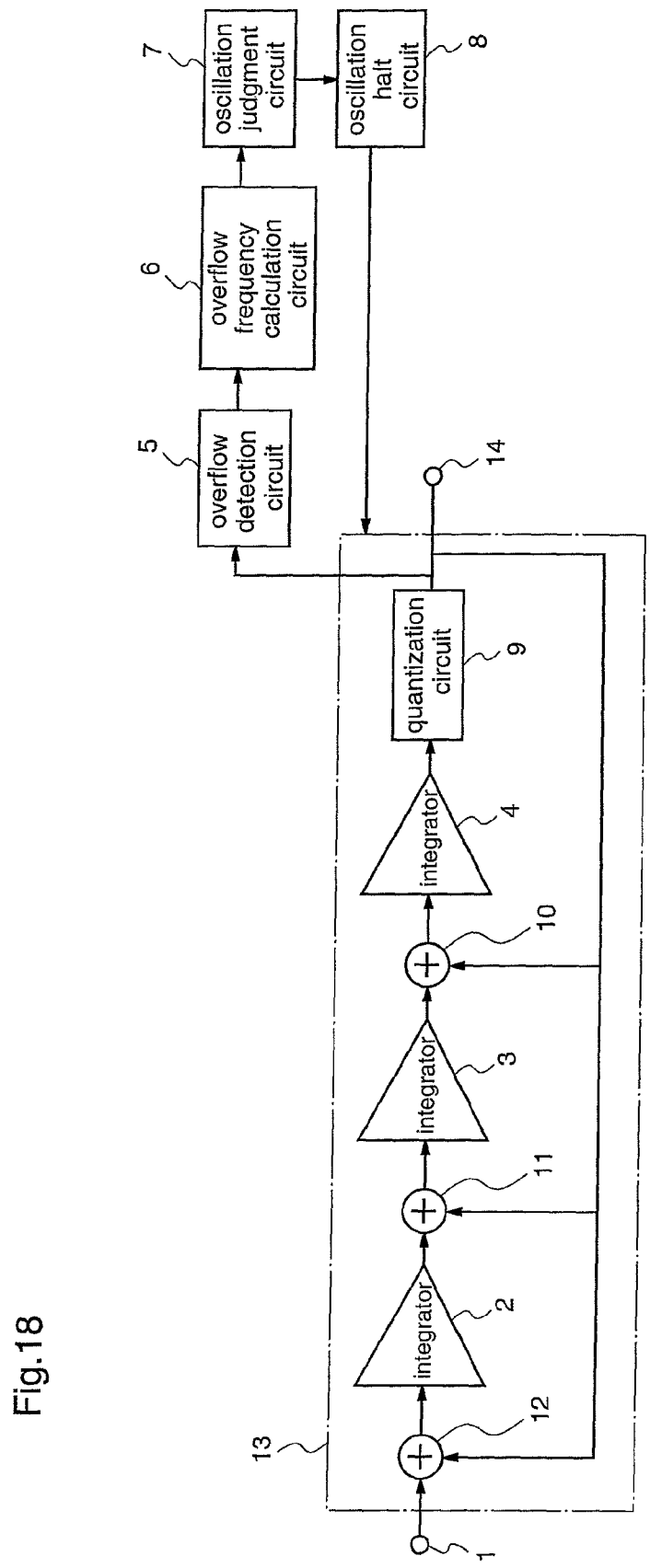
FIG. 18 is a block diagram illustrating a semiconductor device according to a tenth embodiment of the present invention.
Figure 19:
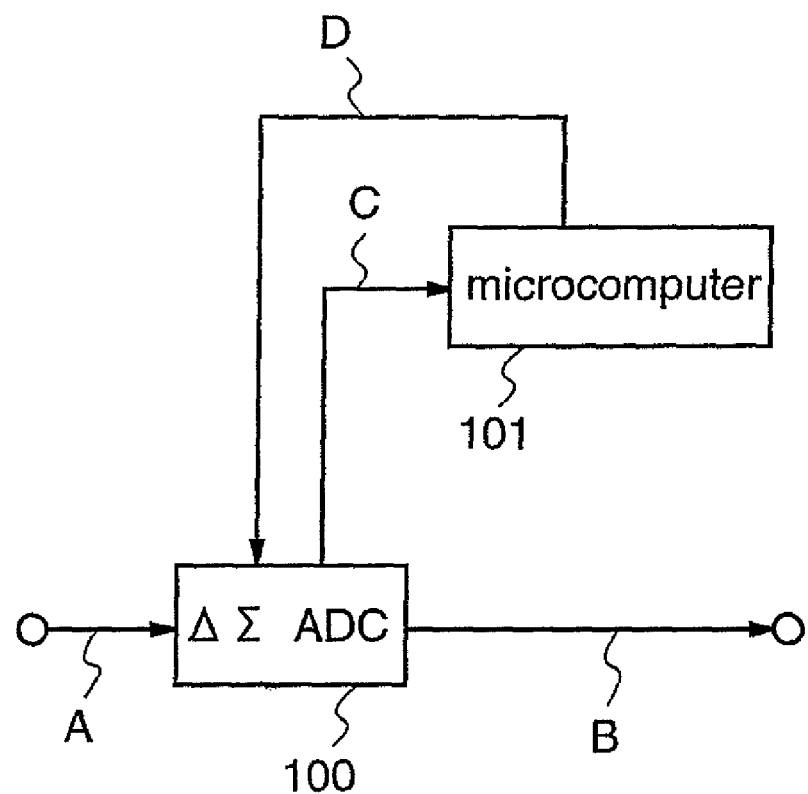
FIG. 19 is a block diagram illustrating the conventional semiconductor device.

FIG. 18 is a block diagram illustrating the configuration of a semiconductor device according to a tenth embodiment of the present invention. Since the reference numerals 1 to 4 and 6 to 14 in FIG. 18 are identical to those in FIG. 1, repeated description is not necessary. The semiconductor device of this tenth embodiment is obtained by configuring the semiconductor device of the first embodiment shown in FIG. 1 such that the output of the quantization circuit 9 is input to the overflow detection circuit 5.

In FIG. 18, when the quantization circuit 9 is a multi-bit quantization circuit, the overflow detection circuit 5 compares the output of the quantization circuit 9 with a predetermined value, and outputs a signal indicating the overflow state as an overflow detection signal when the output of the quantization circuit 9 exceeds the predetermined value. For example, when the quantization circuit 9 is composed of a 3-bit comparator, the digital output from the quantization circuit 9 is 0 to 7, and the overflow detection circuit 5 can detect the overflow state when the digital output from the quantization circuit 9 is 6 or more, with the reference value in the overflow detection circuit 5 being set at 6.

In the semiconductor device of the first embodiment shown in FIG. 1, the overflow detection circuit 5 compares the voltages of the analog signals outputted from the integrators 2 to 4 in the ΔΣ modulator 13 with the reference value to perform overflow detection. On the other hand, in the semiconductor device of this tenth embodiment shown in FIG. 18, the overflow detection circuit 5 compares the digital signal outputted from the quantization circuit 9 with the reference value to judge the overflow state by the output of the quantization circuit 9, and thereby the configuration of the overflow detection circuit 5 can be simplified.

As described above, in the semiconductor device of this tenth embodiment, when the output signal from the ΔΣ modulator 13 is a multi-bit signal, the overflow detection circuit 5 compares the output signal from the quantization circuit 9 with the predetermined value to output the overflow detection signal. Therefore, the area of the overflow detection circuit 5 and the power consumption thereof can be reduced, and further, the trouble in designing the overflow detection circuit 5 can be saved.

APPLICABILITY IN INDUSTRY

The semiconductor device and the semiconductor system of the present invention are applicable to such as a radio receiving device which digital-processing radio reception.

The invention claimed is:

1. A semiconductor device comprising:
   a ΔΣ modulator having a quantizer which quantizes output signals of integrators;
   an overflow detection circuit which compares the output of at least one integrator in the ΔE modulator with a predetermined value to output an overflow detection signal;
   an overflow frequency calculation circuit which calculates an overflow frequency value that is the frequency of the output from the integrator being outside a normal range, based on the overflow detection signal, and outputs the overflow frequency value;
   an oscillation judgment circuit which judges whether the ΔΣ modulator is in the oscillation state or not based on the overflow frequency value; and
   an oscillation halt circuit which suppresses oscillation of the ΔΣ modulator when the oscillation judgment circuit judges that the ΔΣ modulator is in the oscillation state.
2. A semiconductor device as defined in claim 1 wherein when the output signal of the ΔΣ modulator is a multi-bit signal, said overflow detection circuit compares the output signal of the quantizer in the ΔΣ modulator with a predetermined value to output an overflow detection signal.
3. A semiconductor device as defined in claim 1 wherein the predetermined value of the overflow detection circuit is variable.
4. A semiconductor device as defined in claim 1 wherein said overflow frequency calculation circuit integrates the overflow detection signal to output the overflow frequency value.
5. A semiconductor device as defined in claim 4 wherein said oscillation judgment circuit is a comparator which compares the overflow frequency value with a predetermined value, and said oscillation halt circuit initializes the integrators in the ΔΣ modulator.
6. A semiconductor device as defined in claim 1 wherein said overflow frequency calculation circuit counts the number of times the overflow detection signal is detected within a predetermined period, and outputs the count value as the overflow frequency value.
7. A semiconductor device as defined in claim 1 wherein said oscillation judgment circuit compares the overflow frequency value with a threshold value, and judges that the ΔΣ modulator is in the oscillation state when the number of times by which the state where the overflow frequency value becomes equal to or larger than the threshold value is continued becomes equal to or larger than a predetermined number of times.
8. A semiconductor device as defined in claim 1 wherein the period for calculating the overflow frequency value and the threshold value of the oscillation judgment circuit are variable.
9. A semiconductor device as defined in claim 1 wherein said overflow frequency calculation circuit is a low-pass filter.
10. A semiconductor device as defined in claim 1 wherein said oscillation judgment circuit is a comparator which compares the overflow frequency value with a predetermined value.
11. A semiconductor device as defined in claim 1 wherein said oscillation halt circuit is software.
12. A semiconductor device as defined in claim 1 wherein said oscillation halt circuit is hardware.
13. A semiconductor device as defined in claim 1 wherein said oscillation halt circuit can be switched between software and hardware.
14. A semiconductor device as defined in claim 1 wherein said oscillation halt circuit initializes the integrators in the ΔΣ modulator.
15. A semiconductor device as defined in claim 1 wherein said oscillation halt circuit changes the multipliers of the integrators in the ΔΣ modulator.
16. A semiconductor device as defined in claim 1 wherein said oscillation halt circuit narrows the output range of the integrators in the ΔΣ modulator.
17. A semiconductor device as defined in claim 1 wherein said ΔΣ modulator is a D/A converter.
18. A semiconductor device as defined in claim 17 wherein said overflow detection circuit does not output the overflow detection signal until the ΔΣ modulator is stabilized immediately after start-up or after oscillation is suppressed.
19. A semiconductor system having a semiconductor device as defined in claim 18 further including
   a signal processing circuit which processes the data outputted from the semiconductor device, and
   said signal processing circuit adjusting the output of the ΔΣ modulator to fade out or turn off the same when the oscillation judgment circuit judges that the ΔΣ modulator is in the oscillation state.
20. A semiconductor system as defined in claim 19 further including
   a just-before-oscillation judgment circuit which judges whether the ΔΣ modulator is in the state just before oscillation or not based on the overflow frequency value, wherein the predetermined value of the overflow detection circuit is changed to a value within a range of reference values obtained when no oscillation is detected, the overflow frequency calculation circuit calculates the overflow frequency value on the basis of the overflow detection signal which is obtained by comparing the output of the integrator in the ΔΣ modulator with the changed predetermined value by the overflow detection circuit, and the just-before-oscillation judgment circuit detects the state of the ΔΣ modulator just before oscillation.

21. A semiconductor system having a semiconductor device as defined in claim 18 further including
an input amplitude restriction circuit which outputs the data with its input amplitude being adjusted, to the ΔΣ modulator in the semiconductor device, and
said input amplitude restriction circuit adjusting the input amplitude of the ΔΣ modulator when the oscillation judgment circuit judges that the ΔΣ modulator is in the oscillation state.

22. A semiconductor system as defined in claim 19 further including
a just-before-oscillation judgment circuit which judges whether the ΔΣ modulator is in the state just before oscillation or not based on the overflow frequency value,
wherein the judgment reference value of the just-before-oscillation judgment circuit is changed to a value within a range of reference values obtained when no oscillation is detected, and the just-before-oscillation judgment circuit compares the overflow frequency value with the changed judgment reference value to detect the state of the ΔΣ modulator just before oscillation.

23. A semiconductor device as defined in claim 17 wherein said overflow frequency calculation circuit does not output the overflow frequency value until the ΔΣ modulator is stabilized immediately after start-up or after oscillation is suppressed.

24. A semiconductor device as defined in claim 17 wherein said oscillation judgment circuit does not judge that the ΔΣ modulator is in the oscillation state until the ΔΣ modulator is stabilized immediately after start-up or after oscillation is suppressed.

25. A semiconductor device as defined in claim 17 wherein said oscillation halt circuit does not halt oscillation until the ΔΣ modulator is stabilized immediately after start-up or after oscillation is suppressed.

26. A semiconductor device as defined in claim 1 wherein said ΔΣ modulator is an A/D converter.

27. A semiconductor device comprising:
a ΔΣ A/D converter which outputs an overflow detection signal; and
an oscillation detection circuit which integrates the overflow detection signal to detect the oscillation state of the ΔΣ A/D converter;
said oscillation detection circuit including
a count circuit which counts the number of times the overflow detection signal is detected within a predetermined period, and outputs the count value,
a comparison circuit which compares the count value with a threshold value, and judges that the ΔΣ A/D converter is in the oscillation state when the number of overflow detections within the predetermined period is equal to or larger than the threshold value, and then enables the oscillation detection signal to output the same, and
a reset generation circuit which receives the oscillation detection signal, and generates a hard reset signal for resetting the ΔΣ A/D converter,
wherein said oscillation detection circuit resets the ΔΣ A/D converter when the oscillation detection circuit detects that the ΔΣ A/D converter is in the oscillation state.

28. A semiconductor device as defined in claim 27 further including
a microcomputer which transfers an oscillation detection condition setting command to the oscillation detection circuit,
wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer, with the oscillation detection threshold value setting which is outputted from the microcomputer.

29. A semiconductor system having a semiconductor device as defined in claim 27 further including
a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

30. A semiconductor device comprising:
a ΔΣ A/D converter which outputs an overflow detection signal;
an oscillation detection circuit which integrates the overflow detection signal to detect the oscillation state of the ΔΣ A/D converter; and
a microcomputer which transfers a command for resetting the ΔΣ A/D converter on the basis of an oscillation detection monitor signal outputted from the oscillation detection circuit;
said oscillation detection circuit including
a count circuit which counts the number of times the overflow detection signal is detected within a predetermined period, and outputs the count value, and
a comparison circuit which compares the count value with a threshold value, and judges that the ΔΣ A/D converter is in the oscillation state when the number of overflow detections within the predetermined period is equal to or larger than the threshold value, and then outputs the oscillation detection monitor signal holding the oscillation detection information to the microcomputer,
wherein said microcomputer resets the ΔΣ A/D converter when the oscillation detection circuit detects that the ΔΣ A/D converter is in the oscillation state.

31. A semiconductor system having a semiconductor device as defined in claim 30, further including
an input amplitude restriction circuit which outputs the data with its input amplitude being adjusted, to the ΔΣ A/D converter in the semiconductor device,
said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and
said input amplitude restriction circuit outputting the data with its input amplitude being reduced when the ΔΣ A/D converter is in the oscillation state.

32. A semiconductor device as defined in claim 30 further including
a microcomputer which transfers an oscillation detection condition setting command to the oscillation detection circuit, wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer, with the oscillation detection threshold value setting which is outputted from the microcomputer.

33. A semiconductor system having a semiconductor device as defined in claim 30 further including
a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

34. A semiconductor device comprising:
a ΔΣ A/D converter which outputs an overflow detection signal;
an oscillation detection circuit which integrates the overflow detection signal to detect the oscillation state of the ΔΣ A/D converter;
a microcomputer which transfers a command for resetting the ΔΣ A/D converter on the basis of an oscillation detection monitor signal outputted from the oscillation detection circuit; and
a reset selection circuit which selects either of the oscillation detection circuit or the microcomputer to be used for resetting the ΔΣ A/D converter;
said oscillation detection circuit including
a count circuit which counts the number of times the overflow detection signal is detected within a predetermined period, and outputs the count value,
a comparison circuit which compares the count value with a threshold value, and judges that the ΔΣ A/D converter is in the oscillation state when the number of overflow detections within the predetermined period is equal to or larger than the threshold value, and then enables and outputs the oscillation detection signal and outputs the oscillation detection monitor signal holding the oscillation detection information to the microcomputer, and
a reset generation circuit which receives the oscillation detection signal, and outputs a hard reset signal for resetting the ΔΣ A/D converter,
wherein, when the oscillation detection circuit detects that the ΔΣ A/D converter is in the oscillation state, said reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

35. A semiconductor device as defined in claim 34 further including
a microcomputer which transfers an oscillation detection condition setting command to the oscillation detection circuit,
wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer, with the oscillation detection threshold value setting which is outputted from the microcomputer.

36. A semiconductor system having a semiconductor device as defined in claim 34 further including a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

37. A semiconductor system having a semiconductor device as defined in claim 34, further including
an input amplitude restriction circuit which outputs the data with its input amplitude being adjusted, to the ΔΣ A/D converter in the semiconductor device,
said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and
said input amplitude restriction circuit outputting the data with its input amplitude being reduced when the ΔΣ A/D converter is in the oscillation state.

38. A semiconductor device comprising:
a ΔΣ A/D converter which outputs an overflow detection signal; and
an oscillation detection circuit which integrates the overflow detection signal to detect the oscillation state of the ΔΣ A/D converter;
said oscillation detection circuit including
a count circuit which counts the number of times the overflow detection signal is detected within a predetermined period after waiting until the ΔΣ A/D converter is stabilized, and outputs the count value,
a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then enables the oscillation detection signal to output the same, and
a reset generation circuit which receives the oscillation detection signal, and generates a hard reset signal for resetting the ΔΣ A/D converter,
wherein the oscillation detection circuit resets the ΔΣ A/D converter when it detects that the ΔΣ A/D converter is in the oscillation state.

39. A semiconductor device as defined in claim 38 further including
a microcomputer which transfers an oscillation detection condition setting command to the oscillation detection circuit,
wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer, with the oscillation detection threshold value setting which is outputted from the microcomputer.

40. A semiconductor system having a semiconductor device as defined in claim 38 further including
a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

41. A semiconductor device comprising:

a ΔΣ A/D converter which outputs an overflow detection signal;

an oscillation detection circuit which integrates the overflow detection signal to detect the oscillation state of the ΔΣ A/D converter; and a microcomputer which transfers a command for resetting the ΔΣ A/D converter on the basis of an oscillation detection monitor signal outputted from the oscillation detection circuit;

said oscillation detection circuit including a count circuit which counts the number of times the overflow detection signal is detected within a predetermined period after waiting until the ΔΣ A/D converter is stabilized, and outputs the count value, and a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then outputs the oscillation detection monitor signal holding the oscillation detection information to the microcomputer, wherein said microcomputer resets the ΔΣ A/D converter when the oscillation detection circuit detects that the ΔΣ A/D converter is in the oscillation state.

42. A semiconductor device as defined in claim 41 further including a microcomputer which transfers an oscillation detection condition setting command to the oscillation detection circuit, wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer, with the oscillation detection threshold value setting which is outputted from the microcomputer.

43. A semiconductor system having a semiconductor device as defined in claim 41 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

44. A semiconductor system having a semiconductor device as defined in claim 41, further including an input amplitude restriction circuit which outputs the data with its input amplitude being adjusted, to the ΔΣ A/D converter in the semiconductor device, said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and said input amplitude restriction circuit outputting the data with its input amplitude being reduced when the ΔΣ A/D converter is in the oscillation state.

45. A semiconductor device comprising:

a ΔΣ A/D converter which outputs an overflow detection signal;

an oscillation detection circuit which integrates the overflow detection signal to detect the oscillation state of the ΔΣ A/D converter;

a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter;

said oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of overflow detections within the predetermined period after waiting until the ΔΣ A/D converter is stabilized is equal to or larger than the threshold value, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, said reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

46. A semiconductor device as defined in claim 45 further including a microcomputer which transfers an oscillation detection condition setting command to the oscillation detection circuit, wherein said oscillation detection circuit judges whether the ΔΣ A/D converter is in the oscillation state or not by comparing the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer, with the oscillation detection threshold value setting which is outputted from the microcomputer.

47. A semiconductor system having a semiconductor device as defined in claim 45 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

48. A semiconductor system having a semiconductor device as defined in claim 45, further including an input amplitude restriction circuit which outputs the data with its input amplitude being adjusted, to the ΔΣ A/D converter in the semiconductor device, said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and said input amplitude restriction circuit outputting the data with its input amplitude being reduced when the ΔΣ A/D converter is in the oscillation state.

49. A semiconductor device comprising:

a ΔΣ A/D converter which outputs an overflow detection signal; and an oscillation detection circuit which integrates the overflow detection signal to detect the oscillation state of the ΔΣ A/D converter;

said oscillation detection circuit including a count circuit which counts the number of times the overflow detection signal is detected within a predetermined period, and outputs the count value, a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then enables the oscillation detection signal to output the same, and a reset generation circuit which receives the oscillation detection signal, and generates a hard reset signal for resetting the ΔΣ A/D converter, wherein the oscillation detection circuit resets the ΔΣ A/D converter when it detects that the ΔΣ A/D converter is in the oscillation state.

50. A semiconductor device as defined in any of claim 49 further including a microcomputer which transfers an oscillation detection condition setting command to the oscillation detection circuit, wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer is larger than the oscillation detection threshold value setting which is outputted from the microcomputer is continued by the number of times equal to or larger than the oscillation detection continuous number of times setting which is outputted from the microcomputer.

51. A semiconductor system having a semiconductor device as defined in claim 49 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

52. A semiconductor device comprising:

a ΔΣ A/D converter which outputs an overflow detection signal;

an oscillation detection circuit which integrates the overflow detection signal to detect the oscillation state of the ΔΣ A/D converter; and a microcomputer which transfers a command for resetting the ΔΣ A/D converter on the basis of an oscillation detection monitor signal outputted from the oscillation detection circuit;

said oscillation detection circuit including a count circuit which counts the number of times the overflow detection signal is detected within a predetermined period, and outputs the count value, and a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then outputs the oscillation detection monitor signal holding the oscillation detection information to the microcomputer, wherein said microcomputer resets the ΔΣ A/D converter when the oscillation detection circuit detects that the ΔΣ A/D converter is in the oscillation state.

53. A semiconductor device as defined in claim 52 further including a microcomputer which transfers an oscillation detection condition setting command to the oscillation detection circuit, wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer is larger than the oscillation detection threshold value setting which is outputted from the microcomputer is continued by the number of times equal to or larger than the oscillation detection continuous number of times setting which is outputted from the microcomputer.

54. A semiconductor system having a semiconductor device as defined in claim 52 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

55. A semiconductor system having a semiconductor device as defined in claim 52, further including an input amplitude restriction circuit which outputs the data with its input amplitude being adjusted, to the ΔΣ A/D converter in the semiconductor device, said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and said input amplitude restriction circuit outputting the data with its input amplitude being reduced when the ΔΣ A/D converter is in the oscillation state.

56. A semiconductor device comprising:

a ΔΣ A/D converter which outputs an overflow detection signal;

an oscillation detection circuit which integrates the overflow detection signal to detect the oscillation state of the ΔΣ A/D converter;

a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter;

said oscillation detection circuit including
a count circuit which counts the number of times the overflow detection signal is detected within a predetermined period, and outputs the count value,
a comparison circuit which compares the count value with a threshold value, and judges that the ΔΣ A/D converter is in the oscillation state when the number of times by which the state where the number of overflow detections within the predetermined period becomes equal to or larger than a threshold value is continued becomes equal to or larger than a predetermined number of times, and then enables and outputs the oscillation detection signal and outputs the oscillation detection monitor signal holding the oscillation detection information to the microcomputer, and
a reset generation circuit which receives the oscillation detection signal, and outputs a hard reset signal for resetting the ΔΣ A/D converter,
wherein, when the oscillation detection circuit detects that the ΔΣ A/D converter is in the oscillation state, said reset selection circuit selects either of resetting the ΔΣ A/D converter by the oscillation detection circuit or resetting the ΔΣ A/D converter by the microcomputer, based on a ΔΣ A/D converter hard reset enable setting which is set by the microcomputer.

57. A semiconductor device as defined in claim 56 further including
a microcomputer which transfers an oscillation detection condition setting command to the oscillation detection circuit,
wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer is larger than the oscillation detection threshold value setting which is outputted from the microcomputer is continued by the number of times equal to or larger than the oscillation detection continuous number of times setting which is outputted from the microcomputer.

58. A semiconductor system having a semiconductor device as defined in claim 56 further including
a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

59. A semiconductor system having a semiconductor device as defined in claim 56, further including
an input amplitude restriction circuit which outputs the data with its input amplitude being adjusted, to the ΔΣ A/D converter in the semiconductor device,
said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and
said input amplitude restriction circuit outputting the data with its input amplitude being reduced when the ΔΣ A/D converter is in the oscillation state.

60. A semiconductor device comprising:
a ΔΣ A/D converter which outputs an overflow detection signal; and
an oscillation detection circuit which integrates the overflow detection signal to detect the oscillation state of the ΔΣ A/D converter;
said oscillation detection circuit including
a count circuit which counts the number of times the overflow detection signal is detected within a predetermined period after waiting until the ΔΣ A/D converter is stabilized, and outputs the count value,
a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then enables the oscillation detection signal to output the same, and
a reset generation circuit which receives the oscillation detection signal, and generates a hard reset signal for resetting the ΔΣ A/D converter,
wherein the oscillation detection circuit resets the ΔΣ A/D converter when it detects that the ΔΣ A/D converter is in the oscillation state.

61. A semiconductor device as defined in claim 60 further including
a microcomputer which transfers an oscillation detection condition setting command to the oscillation detection circuit,
wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer is larger than the oscillation detection threshold value setting which is outputted from the microcomputer is continued by the number of times equal to or larger than the oscillation detection continuous number of times setting which is outputted from the microcomputer.

62. A semiconductor system having a semiconductor device as defined in claim 60 further including
a signal processing circuit which processes data outputted from the semiconductor device, and
said signal processing circuit receiving a ΔΣ A/D converter reset signal from the semiconductor device, and performing a fadeout processing for the data when the ΔΣ A/D converter is reset.

63. A semiconductor device comprising:
a ΔΣ A/D converter which outputs an overflow detection signal;
an oscillation detection circuit which integrates the overflow detection signal to detect the oscillation state of the ΔΣ A/D converter; and
a microcomputer which transfers a command for resetting the ΔΣ A/D converter on the basis of an oscillation detection monitor signal outputted from the oscillation detection circuit;
said oscillation detection circuit including
a count circuit which counts the number of times the overflow detection signal is detected within a predetermined period after waiting until the ΔΣ A/D converter is stabilized, and outputs the count value, and
a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then outputs the oscillation detection monitor signal holding the oscillation detection information to the microcomputer, wherein said microcomputer resets the ΔΣ A/D converter when the oscillation detection circuit detects that the ΔΣ A/D converter is in the oscillation state.

64. A semiconductor device as defined in claim 63 further including a microcomputer which transfers an oscillation detection condition setting command to the oscillation detection circuit, wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer is larger than the oscillation detection threshold value setting which is outputted from the microcomputer is continued by the number of times equal to or larger than the oscillation detection continuous number of times setting which is outputted from the microcomputer.

65. A semiconductor system having a semiconductor device as defined in claim 63 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

66. A semiconductor system having a semiconductor device as defined in claim 63, further including an input amplitude restriction circuit which outputs the data with its input amplitude being adjusted, to the ΔΣ A/D converter in the semiconductor device, said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and said input amplitude restriction circuit outputting the data with its input amplitude being reduced when the ΔΣ A/D converter is in the oscillation state.

67. A semiconductor device comprising:

a ΔΣ A/D converter which outputs an overflow detection signal;

an oscillation detection circuit which integrates the overflow detection signal to detect the oscillation state of the ΔΣ A/D converter;

a microcomputer which transfers a command for resetting the ΔΣ A/D converter on the basis of an oscillation detection monitor signal outputted from the oscillation detection circuit; and a reset selection circuit which selects either of the oscillation detection circuit or the microcomputer to be used for resetting the ΔΣ A/D converter;

said oscillation detection circuit including a count circuit which counts the number of times the overflow detection signal is detected within a predetermined period after waiting until the ΔΣ A/D converter is stabilized, and outputs the count value, a comparison circuit which compares the count value with a threshold value, and judges that the ΔΣ A/D converter is in the oscillation state when the number of times by which the state where the number of overflow detections within the predetermined period after waiting until the ΔΣ A/D converter is stabilized becomes equal to or larger than a threshold value is continued becomes equal to or larger than a predetermined number of times, and then enables and outputs the oscillation detection signal and outputs the oscillation detection monitor signal holding the oscillation detection information to the microcomputer, and a reset generation circuit which receives the oscillation detection signal, and outputs a hard reset signal for resetting the ΔΣ A/D converter, wherein, when the oscillation detection circuit detects that the ΔΣ A/D converter is in the oscillation state, said reset selection circuit selects either of resetting the ΔΣ A/D converter by the oscillation detection circuit or resetting the ΔΣ A/D converter by the microcomputer, based on a ΔΣ A/D converter hard reset enable setting which is set from the microcomputer.

68. A semiconductor device as defined in claim 67 further including a microcomputer which transfers an oscillation detection condition setting command to the oscillation detection circuit, wherein said oscillation detection circuit judges that the ΔΣ A/D converter is in the oscillation state when the state where the result of counting the number of detection times of the overflow detection signal within the predetermined period based on the oscillation detection period setting which is outputted from the microcomputer after waiting until the ΔΣ A/D converter is stabilized based on the ΔΣ A/D converter stabilization wait setting which is outputted from the microcomputer is larger than the oscillation detection threshold value setting which is outputted from the microcomputer is continued by the number of times equal to or larger than the oscillation detection continuous number of times setting which is outputted from the microcomputer.

69. A semiconductor system having a semiconductor device as defined in claim 67 further including a signal processing circuit which processes data outputted from the semiconductor device, and said signal processing circuit receiving a ΔΣ A/D converter reset signal from the semiconductor device, and performing a fadeout processing for the data when the ΔΣ A/D converter is reset.

70. A semiconductor system having a semiconductor device as defined in claim 67, further including an input amplitude restriction circuit which outputs the data with its input amplitude being adjusted, to the ΔΣ A/D converter in the semiconductor device, said microcomputer in the semiconductor device confirming the oscillation detection monitor signal, and transferring a ΔΣ A/D converter oscillation confirmation command to the input amplitude restriction circuit when the ΔΣ A/D converter is in the oscillation state, and said input amplitude restriction circuit outputting the data with its input amplitude being reduced when the ΔΣ A/D converter is in the oscillation state.

* * * * *